United States Patent
Iijima et al.

(10) Patent No.: US 7,527,085 B2
(45) Date of Patent: May 5, 2009

(54) ELECTRONIC COMPONENT COOLING APPARATUS

(75) Inventors: Masayuki Iijima, Nagano (JP); Tomoaki Ikeda, Nagano (JP); Masashi Miyazawa, Nagano (JP); Kouji Ueno, Nagano (JP); Paul J. Gwin, Orangevale, CA (US); Brian J. Long, Folsom, CA (US); Peter A. Davison, Puyallup, WA (US); Rolf A. Konstad, Gold River, CA (US)

(73) Assignees: Sanyo Denki Co., Ltd., Tokyo (JP); Intel Corporation, Santa Clara, CA (US)

( * ) Notice: Subject to any disclaimer, the term of this patent is extended or adjusted under 35 U.S.C. 154(b) by 666 days.

(21) Appl. No.: 11/049,353

(22) Filed: Feb. 2, 2005

(65) Prior Publication Data

US 2005/0168939 A1    Aug. 4, 2005

(30) Foreign Application Priority Data

Feb. 3, 2004 (JP) .............................. 2004-027312

(51) Int. Cl.
 F28F 7/00 (2006.01)
 F28D 15/00 (2006.01)
 H05K 7/20 (2006.01)
(52) U.S. Cl. ................................. 165/80.4; 165/104.33
(58) Field of Classification Search ................ 165/80.4, 165/104.33, 104.34, 121, 122, 76–79; 361/699, 361/702–704; 285/26; 415/177
See application file for complete search history.

(56) References Cited

U.S. PATENT DOCUMENTS

| | | | | |
|---|---|---|---|---|
| 3,817,321 A * | 6/1974 | Von Cube et al. | ...... | 165/104.22 |
| 4,365,930 A * | 12/1982 | Ogura et al. | ................... | 415/61 |
| 4,722,305 A * | 2/1988 | Haskell | ..................... | 123/41.27 |
| 5,519,574 A | 5/1996 | Kodama et al. | | |
| 5,555,929 A * | 9/1996 | Ishikawa | ...................... | 165/76 |
| 5,951,059 A * | 9/1999 | Kitamura | ...................... | 285/24 |
| 6,105,662 A | 8/2000 | Suzuki | | |
| 6,152,213 A | 11/2000 | Suzuki | | |
| 6,333,849 B1 | 12/2001 | Donahoe et al. | | |
| 6,496,367 B2 | 12/2002 | Donahoe et al. | | |
| 6,510,052 B2 | 1/2003 | Ishikawa et al. | | |
| 6,530,419 B1 | 3/2003 | Suzuki | | |
| 6,619,380 B1* | 9/2003 | Hartman et al. | ................ | 165/71 |
| 6,639,797 B2 | 10/2003 | Sacki et al. | | |
| 6,702,002 B2* | 3/2004 | Wang | ........................ | 165/80.3 |
| 2003/0201092 A1* | 10/2003 | Gwin et al. | ................. | 165/80.4 |
| 2004/0008483 A1* | 1/2004 | Cheon | ......................... | 361/687 |
| 2004/0125561 A1* | 7/2004 | Gwin et al. | .................. | 361/699 |
| 2005/0011635 A1* | 1/2005 | Liu et al. | .................. | 165/109.1 |

* cited by examiner

*Primary Examiner*—Tho v Duong
(74) *Attorney, Agent, or Firm*—Rankin, Hill & Clark LLP

(57) ABSTRACT

A small water-cooling type electronic component cooling apparatus is provided. The electronic component cooling apparatus comprises a so-called water-cooling heat sink 3, a radiator 7 cooled by an electric fan 5, first and second coolant paths 9, 11 for circulating a coolant between the heat sink 3 and the radiator 7, and an electric pump 13 to supply a moving energy to the coolant. The electric pump 13 is arranged at a position facing the heat-radiating portion of the radiator 7.

28 Claims, 21 Drawing Sheets

ELECTRONIC COMPONENT COOLING APPARATUS

FIELD OF THE INVENTION

The present invention relates to an electronic component cooling apparatus to forcibly cool electronic components such as microcomputers and also to an electric pump and a heat sink both used in the electronic component cooling apparatus.

DESCRIPTION OF THE RELATED ART

Most of conventional electronic component cooling apparatus, as disclosed in U.S. Pat. No. 5,519,574, comprise a combination of a heat sink and an electric fan. The heat sink has a plurality of radiation fins formed on a surface of a base plate, and the electric fan is adapted to forcibly air-cool the surfaces of the radiation fins and the base plate.

As the amount of heat produced in electronic components increases, a problem arises that simply air-cooling the heat sink cannot sufficiently cool the electronic components.

An object of the present invention is to provide an electronic component cooling apparatus capable of sufficiently water-cooling electronic components that produce a large amount of heat.

Another object of the present invention is to provide a small water-cooling type electronic component cooling apparatus.

Still another object of the present invention is to provide a small electronic component cooling apparatus with a high cooling capability.

Yet another object of the present invention is to provide an electronic component cooling apparatus in which the electric fan is easily mounted to a radiator.

A further object of the present invention is to provide an electronic component cooling apparatus in which a fan guard is easily mounted.

A further object of the present invention is to provide an electronic component cooling apparatus in which the fan guard can be mounted easily and reliably.

A further object of the present invention-is to provide an electronic component cooling apparatus capable of enhancing a cooling performance without increasing a size of the heat sink, and also provide such a heat sink.

A further object of the present invention is to provide an electronic component cooling apparatus capable of suppressing a temperature rise in the electric pump.

A further object of the present invention is to provide an electronic component cooling apparatus which does not require a reserve tank.

A further object of the present invention is to provide an electronic component cooling apparatus having a radiator so constructed that air cannot easily get into a circulating coolant.

A further object of the present invention is to provide an electronic component cooling apparatus having a radiator so constructed that it will not be damaged by an atmospheric temperature change.

A further object of the present invention is to provide an electronic component cooling apparatus in which piping tubes are easily connected and their connections are firm and in which the tubes can easily be bent.

A further object of the present invention is to provide an electronic component cooling apparatus which facilitates its maintenance.

A further object of the present invention is to provide an electronic component cooling apparatus in which a gasket is reliably mounted.

A further object of the present invention is to provide an electric pump suited for use in the electronic component cooling apparatus.

A further object of the present invention is to provide an electric pump whose operation state can checked.

A further object of the present invention is to provide an electric pump which can perform its pumping operation normally without being affected by dirt or bubbles.

A further object of the present invention is to provide an electric pump which is not affected by dirt or bubbles and has a small power consumption.

SUMMARY OF THE INVENTION

The present invention provides a so-called water-cooling type electronic component cooling apparatus which comprises, as main constitutional elements, a heat sink cooled by a coolant to cool an electronic component such as CPU, a radiator to cool the coolant, an electric fan to cool the radiator, and an electric pump to circulate the coolant. The heat sink has an electronic component mounting surface on which an electronic component to be cooled is mounted, a coolant inlet and a coolant outlet, and a coolant path through which a liquid as a coolant flows to forcibly cool the electronic component mounting surface. The radiator has a coolant inlet and a coolant outlet and a liquid path in which the coolant flows, the liquid path being air-cooled to cool the coolant. The electric fan is mounted on a heat-radiating portion of the radiator to generate a cooling air flow by a rotation of an impeller having a plurality of blades and thereby cool the heat-radiating portion of the radiator. Typically, the electric fan draws in air from the heat-radiating portion side of the radiator to cool the heat-radiating portion.

The electric pump supplies the coolant from the coolant outlet of the radiator to the coolant inlet of the heat sink and supplies the coolant from the coolant outlet of the heat sink to the coolant inlet of the radiator.

In this invention, the electric pump is arranged at a position opposing a non-impeller-facing area of the heat-radiating portion of the radiator different from an impeller-facing area of the heat-radiating portion. In making the most of the function of the radiator to cool the coolant, an idea of putting in front of the heat-radiating portion of the radiator an object that hinders the flow of cooling air generated by the electric fan is considered undesirable by a person skilled in the art. In this invention, however, this common sense is challenged and the electric pump is placed in that part of the front area of the heat-radiating portion of the radiator which does not face the impeller. Although this arrangement may result in a slight reduction in the cooling performance when compared with a case where the electric pump is not put in front of the heat-radiating portion, since this arrangement allows the electric pump to be installed inside a planar structure of the radiator, an overall size of the electronic component cooling apparatus, which is formed in a planar configuration, can be reduced. To secure a necessary cooling performance, the non-impeller-facing area need only be set to an appropriate size.

The electric fan has a motor to drive the impeller and a housing. The housing has a venturi and a duct-forming wall portion. The venturi has a suction port at one end thereof opposite to the impeller-facing area of the heat-radiating portion of the radiator and a discharge port at the other end. The duct-forming wall portion is formed contiguous to the venturi to guide the cooling air drawn out from the non-impellerfacing area of the heat-radiating portion into the suction port. The duct-forming wall portion allows the cooling air to be drawn out also from the non-impeller-facing area that does not directly oppose the impeller. Thus, the heat-radiating portion of the radiator can be cooled almost entirely. Further, the duct-forming wall portion of the housing is formed with an opening to expose heat generating portions of the electric pump. When the electric pump is arranged so that the heat-generating portions of the electric pump are exposed from the opening, the heat generated by the electric pump can be released to the outside of the housing to protect the heat dissipation performance of the radiator from adverse influences.

The electric pump may be installed in any part of the impeller-facing area. It is particularly preferred, however, that the electric pump be arranged to adjoin one corner of the heat-radiating portion of the radiator. With this arrangement, the electric pump poses the least hindrance to the cooling air flow and therefore minimizes the effects the electric pump has on the cooling performance of the radiator or noise (wind blowing sound) of the fan.

To facilitate the process of mounting the electric fan on the radiator, the following arrangement is preferably taken. For example, the housing is formed integrally with a plurality of engaging pieces. The radiator is provided with a plurality of engaged portions that are engaged by the plurality of engaging pieces to mount the housing on the radiator. With this arrangement the electric fan can be mounted easily to the radiator without using screws.

A casing of the electric pump exposed from the opening in the housing of the electric fan may be provided with an operation state indication means indicating that the electric pump is running. The operation state indication means preferably use a light emitting indication means such as a light emitting diode. Whether the electric fan runs normally or not can be checked easily by looking at the rotating impeller. The operating part of the electric pump, however, cannot be seen from the outside. The provision of the operation state indication means, however, allows the operation state of the electric pump to be checked from the outside, thus facilitating inspection and repair.

The casing of the electric pump exposed from the opening is preferably formed with a plurality of heat dissipating through-holes to release to the outside the heat generated by the heat generating portions of the drive motor installed inside. These heat dissipating through-holes, which release most of the heat produced by the electric pump to the outside of the housing of the electric fan, can minimize the effects the heat of the electric pump has on the radiator. These through-holes can also lower the temperature of the electric pump, thus minimizing the effects of the heat of the electric pump on the coolant passing through the electric pump.

The discharge port of the venturi of the electric fan is preferably attached with a fan guard through a removable mounting structure. The fan guard is not necessarily required. However, if the fan guard is removable, it can be mounted or dismounted according to the requirement of a customer, making it more versatile.

The construction of the fan guard is arbitrary. To facilitate its mounting on the venturi, the fan guard preferably comprises a guard portion facing the discharge port, and a plurality of snap-in hooks provided on an outer circumferential part of the guard portion at circumferential intervals. In this case, the outer circumferential part of the venturi of the electric fan is formed integrally with a plurality of engaged portions to which the plurality of hooks are snap-in-connected. These hooks and engaged portions together form a mounting structure. The snap-in connection refers to a connection structure in which, after the hooks are deflected and get over the engaged portions, the hooks snap into locking engagement with the engaged portions by eliminating or reducing their deflection.

To make the snap-in connection reliable, it is preferred to provide the guard portion of the fan guard with an abutment portion that engages a casing of the motor. The shape and dimension of the abutment portion is determined such that, with the plurality of hooks engaging the plurality of the engaged portions, the abutment portion engages the casing and the guard portion is deflected toward the discharge port. This arrangement causes the hooks to be pressed strongly against the engaged portions by the deflection of the guard portion, securing the reliable snap-in connection.

The outer circumferential part of the venturi is preferably formed integrally with a plurality of stoppers which are provided closer to the housing side than the plurality of engaged portions, and which engage the free ends of the hooks. These stoppers can prevent the hooks from being pushed too much and the guard from being deflected more than necessary and damaged.

The construction of the heat sink used is arbitrary. A preferable heat sink has a base plate, a top plate, and a circumferential wall portion connecting the base plate and the top plate. The base plate has an electronic component mounting surface and a heat-radiating surface which opposes the electronic component mounting surface in the thickness direction and directly contacts the coolant. The top plate has a surface that opposes the heat-radiating surface of the base plate, with a predetermined gap therebetween. The circumferential wall portion connects the base plate and the top plate to form a chamber between the base plate and the top plate. A preferable heat sink has a partition wall portion that divides the chamber. The partition wall portion connects to or is in tight contact with one of paired, opposing circumferential wall constituent parts of the circumferential wall portion, extends toward the other circumferential wall constituent part, and connects to or is in tight contact with the base plate and the top plate. The partition wall portion divides the interior of the chamber into first and second sub-chambers on both sides of the partition wall portion. Between the partition wall portion and the second circumferential wall constituent part, there is formed a communicating passage to communicate the first and second sub-chambers with each other. The coolant inlet of the heat sink is arranged to communicate with a first chamber part region situated on a side opposite to the communicating passage of the first sub-chamber. The coolant outlet of the heat sink are arranged to communicate with a fourth chamber part region of the second sub-chamber situated on a side opposite to the communicating passage. Because in this arrangement the coolant inlet and the coolant outlet of the heat sink are situated close to each other, connection of piping to the heat sink is easily made and the piping poses little hindrance to mounting a heat sink. In the first and second sub-chambers, a plurality of radiation fins are arranged in a manner that heat can be transferred to at least the base plate and the flow of coolant is not blocked. The coolant that enters the first sub-chamber from the coolant inlet comes into contact with the radiation fins in the first sub-chamber and flows through the communicating passage into the second sub-chamber where the coolant contacts radiation fins before being discharged from the coolant outlet. This construction improves the cooling performance without increasing the size of the heat sink. The reason for this is that since a ratio of the widths of the first sub-chamber and the second sub-chamber to the diameters of the coolant inlet and the coolant outlet is not so large, there is no significant difference in the flow velocity and flow rate among the coolant flowing through gaps between the radiation fins in the first sub-chamber and the coolant flowing through gaps between the radiation fins in the second sub-chamber, thus assuring a smooth and efficient transfer of heat from the radiation fins to the coolant.

The radiation fins may comprise a plurality of plate-like radiation fins extending along the partition wall portion. In this arrangement, between adjacent plate-like radiation fins is formed a gap through which the coolant flows. The thickness of each radiation fin and their intervals need only be set to produce a necessary cooling performance. The base plate, the partition wall portion and the plate-like radiation fins can be formed in one piece. The top plate and the circumferential wall portion are also integrally formed. Then upper ends of the partition wall portion and the radiation fins are placed in tight contact with or connected to the top plate. This arrangement provides a heat sink that has as large a heat-radiating surface as possible with a small number of parts. Further, with upper ends of the plate-like radiation fins connected to or put in tight contact with the top plate, the coolant is prevented from flowing between upper end faces of the radiation fins and the top plate. So, the flow of the coolant is limited to through gaps only between the radiation fins. As a result, a reduction in heat transfer from the radiation fins to the coolant is efficiently prevented, thus enhancing the cooling performance.

Forming the coolant inlet and the coolant outlet of the heat sink in the top plate can facilitate the connection of piping to the heat sink, and the presence of piping poses little hindrance to fixedly mounting the heat sink. The coolant inlet and coolant outlet formed in the top plate may be connected with tube connection cylindrical pipes by soldering or brazing. In this case, it is preferred that the tube connection cylindrical pipe be formed integrally with a flange on an outer circumferential part of a base portion thereof, the flange having an annular space to receive a melted metal that leaks from the coolant inlet or outlet to the surface side of the top plate. With the flange provided to the tube connection cylindrical pipe as described above, the melted metal soldered or brazed between a back surface of the top plate and an outer circumferential surface of the base portion of the tube connection cylindrical pipe can be prevented from being viewed from the outside if it leaks out to the surface side of the top plate. Therefore, the appearance of the heat sink is not impaired if the tube connection cylindrical pipe is soldered or brazed to the top plate.

A plurality of the plate-like radiation fins are arranged in an area other than a first chamber part region, a second chamber part region, a third chamber part region connected to the second chamber part region having the communicating passage therebetween, and a fourth chamber part region. Increasing the volume the radiation fins occupy in the chamber more than necessary, however, results in a reduced flow velocity of the coolant, and thereby a degraded cooling performance. When the first to fourth chamber part regions are provided as described above, it is possible to minimize an excessive fall in coolant flow speed even if the radiation fins are installed in the chamber. Those inner wall surface portions of the circumferential wall portion that surround four corners of the chamber preferably have smoothly curved surfaces with no sharp edges. This arrangement can reduce a flow resistance at the corners of the chamber, preventing an undesired fall of flow speed.

The electric pump may have an arbitrary structure. A general rotary electric pump has an impeller having a plurality of radially extending blades and rotating about its axis, and a housing having an impeller-receiving chamber therein. The housing has a liquid inlet and a liquid outlet. The impeller-receiving chamber is constructed such that the impeller installed therein is submerged in the coolant and, when rotated, draws in the coolant from the liquid inlet and delivers it from the liquid outlet. The liquid inlet is formed in one of a plurality of wall portions surrounding the impeller-receiving chamber which opposes the plurality of blades so as to be positioned where the axis is extended. The liquid outlet is formed in one of the wall portions which is situated in a direction perpendicular to the axis. In the electric pump of the above construction, it is preferred that the wall portion with the liquid inlet be formed with an annular groove surrounding the liquid inlet completely and opening toward the impeller, and that the wall portion with the liquid inlet be formed also with a plurality of narrow grooves arranged outside but not connected to the annular groove, radially extending from the axis as a center, and opening toward the impeller. The shapes and dimensions of the annular groove and the plurality of narrow grooves are determined such that dirt and air bubbles entering from the liquid inlet into the impeller-receiving chamber are crushed between the plurality of blades and edges of the annular groove and the narrow grooves, and moved radially outwardly along the narrow grooves by a centrifugal force for discharging from the liquid outlet. This arrangement can effectively prevent a possible degradation of pump performance that would otherwise be caused by dirt and air bubbles in the impeller-receiving chamber. The annular groove may be eliminated. One of the wall surfaces surrounding each narrow groove, which is positioned radially outwardly, may gradually incline toward the wall facing to the plurality of the blades. This inclined surface ensures that bubbles and dirt that are moved radially outwardly by the centrifugal force can be smoothly discharged from the narrow groove without being caught at edges of the groove. When compared with a construction in which one of the surfaces does not incline, this arrangement has little loss when the impeller is rotated, and reduce power consumption.

The plurality of narrow grooves are preferably formed at circumferentially equal intervals. This arrangement eliminates a possibility of the presence of the narrow grooves from causing variations in the rotation of the impeller.

The method of driving the impeller is arbitrary. For example, a plurality of permanent magnetic poles are arranged on the impeller around the axis. A plurality of drive permanent magnetic poles rotated by a drive motor of the electric pump are arranged at positions facing the plurality of permanent magnetic poles through a partition wall. The permanent magnetic poles and the drive permanent magnetic poles may oppose each other in a direction of the axis of the impeller or in a radial direction perpendicular to the axial direction. With this arrangement the impeller can be rotated by a magnetic attraction generated between the plurality of drive permanent magnetic poles and the plurality of permanent magnetic poles. This construction allows the drive motor of the electric pump to be water-proofed easily.

The radiator generally has a heat-radiating portion arranged between an upper tank and a lower tank. In this case, if a direction from the electric fan toward the radiator is taken to be a thickness direction of the radiator, dimensions in the thickness direction of the upper tank and the lower tank are preferably set larger than a dimension in the thickness direction of the heat-radiating portion. This construction allows the upper tank and the lower tank to function as a reserve tank for receiving a reserve coolant to make up for vaporized coolant. It is preferred that a capacity of the upper tank be set larger than that of the lower tank. More specifically speaking, the volume of the upper tank is set larger than that of the lower tank to form an air space in the upper tank which is compressed when the coolant expands. Such an air space prevents a possible damage of the radiator that would be otherwise resulted if an inner pressure of the radiator becomes excessively high when the coolant expands due to an ambient temperature rise.

It is preferred that reducing gas is filled in the air space. Nitrogen gas, for instance, can be used as the reducing gas. The reducing gas filled in the air space can restrict the oxidization of the coolant. Consequently an inner wall contacting the coolant in each component can suppress the oxidization, which can keep the credibility of products over a long period.

It is also preferred to further provide an inlet side extension pipe portion extending from the coolant inlet of the radiator into the upper tank or lower tank, and an outlet side extension pipe portion extending from the coolant outlet of the radiator into the upper tank or lower tank. In that case, the inlet side extension pipe portion and the outlet side extension pipe portion are so arranged that their terminal open ends are always immersed in the coolant whatever attitude the radiator takes. With this arrangement, air can be prevented effectively from entering the inlet side extension pipe portion and the outlet side extension pipe portion whether the air exists in the upper tank or lower tank. This in turn prevents a possible performance reduction of the electric pump and a cooling performance degradation which may occur if air is supplied into the electric pump.

Outer wall portions of the upper tank and the lower tank may be integrally formed with mounting fittings for mounting on a support portion (e.g., frame of computer case). The mounting fittings make very simple a process of mounting the radiator, the heaviest of the parts of the cooling apparatus, onto the support portion. Any desirable structure may be adopted for the mounting fittings. For example, the mounting fittings may comprise first mounting fittings which, when mounted on the support portion, constitute a hinge mechanism and second mounting fittings that are secured to the support portion by using a fixing means such as screws and bolts. In this case, the first mounting fitting attached to the upper tank and the first mounting fitting attached to the lower tank are vertically aligned. The second mounting fittings may also be vertically aligned, as with the first mounting fittings, but their locations are arbitrary. With the first and second mounting fittings, it is possible during a maintenance service of devices incorporating the electronic component cooling apparatus of this invention to pivot the radiator about the hinge mechanism constructed of the first mounting fittings so that parts situated in front of the radiator can be inspected and replaced. Therefore, the presence of a large radiator does not pose any hindrance to the maintenance work.

Each of the first mounting fittings may comprise two pin-like fittings spaced from each other in the thickness direction. In this case, the support portion may be constructed to hold the two pin-like fittings in such a manner that one of the two pin-like fittings pivots a predetermined angle about the other pin-like fitting. The second mounting fittings may be formed with holes through which screws or bolts pass. This arrangement allows the radiator to be mounted or pivoted easily.

In a system including the radiator (path in which the coolant is circulated), the coolant is preferably contained at a pressure lower than an atmospheric pressure. This arrangement ensures that if an ambient temperature rises, the coolant pressure increases only to a level at which the system is not damaged.

Each outer wall portion of the upper and the lower tanks can be integrally formed with one or more reinforcing ribs for enhancing mechanical strength. These reinforcing ribs can restrict the deformation of the outer wall portions of the upper and lower tanks which is caused by fluctuation of pressure in the radiator and of volume of the coolant.

Generally, the coolant inlet and coolant outlet of the radiator, the coolant inlet and coolant outlet of the heat sink and a liquid inlet and liquid outlet of the pump are provided with outwardly extending tube connection cylindrical pipes. In this case, end portions of a flexible tube are fitted over outer circumferential parts of the two associated tube connection cylindrical pipes. It is thus preferred that the outer circumferential part of each of the tube connection cylindrical pipes be formed with one or more edge-forming projections each of which has a inclined surface increasing in diameter from a front end side toward a base portion side of the tube connection cylindrical pipe, and with an edge-forming surface extending from a tip of the inclined surface toward the tube connection cylindrical pipe to form an edge that bites into an inner wall of the tube between the inclined surfaces. As the tube is fitted over the tube connection cylindrical pipe, the edges of the edge-forming projections bite into the inner wall of the tube, securely locking the tube. Therefore, a hose band conventionally required for secure connection is not required. Further, since the edges of the edge-forming projections on the tube connection cylindrical pipe bite into the inner wall of the tube, there is no gap between them, significantly reducing coolant leakage and evaporation from the connected portion. The tube is preferably formed of a material which has high heat resistance, chemical resistance and weatherability and which has little flexibility and elasticity. At present a preferable tube is a plastic tube formed of fluororesin in particular. If a tube is formed of fluororesin with a low permeability to water, it can prevent the coolant from passing through its wall, and thereby the volume of coolant from decreasing. A main part of the tube has formed in its outer circumferential part a spiral groove extending longitudinally of the tube or bellows-like grooves. This arrangement facilitates a tube bending during the heat sink mounting process even if the tube has little flexibility or elasticity.

The portions to be bended of the tube may be bended by forming technique before mounted. If the tube is bended by forming technique before mounted, the tube does not have to be forcibly bended when mounted. Consequently the tube can avoid the reduction of its cooling performance which is caused by an extreme decrease of a cross-sectional area of the tube at a bended portion. Additionally, since the tube is bended by forming technique before mounted, a restoring force is not generated in the tube. Therefore the tube and surrounding components such as an electricity substrate in the system can avoid interfering each other.

A gasket of an elastic material such as sponge and rubber may be interposed between a peripheral portion of the surface of the radiator on the side not facing the electric fan and a support portion so that, when the radiator is secured to the support portion with the gasket interposed therebetween, an air tightness can be enhanced. However, if the gasket is attached to an arbitrary position, a deformed gasket may contact the heat-radiating surface of the heat-radiating portion, reducing an air inflow area of the heat-radiating surface and degrading the cooling performance. Depending on the deformation of the gasket, its contact with the support portion may deteriorate, resulting in a poor air tightness. To solve these problems, the radiator is preferably attached with gasket support members that supports the gasket keeping the gasket out of contact with the heat-radiating portion and which restricts the deformation of the gasket elastic material in such a manner that the gasket, when pressed against the support portion, can be brought into stable, tight contact with the support portion. The use of the gasket support members eliminates the possibility of the gasket is installed at positions where the cooling performance may be affected. Further, since the gasket support members ensure that the gasket is always deformed in a predetermined shape, a degradation of air tightness can be prevented. The gasket support members are preferably mounted removably on the radiator so that they can be removed when the gasket is not needed.

With this invention, not only can an electronic component that generates a large amount of heat be water-cooled (or liquid-cooled) to a sufficient level but the electric pump can also be installed inside a planar structure of the radiator. This in turn offers an advantage that an overall size of the electronic component cooling apparatus can be reduced without significantly degrading the cooling performance.

DETAILED DESCRIPTION OF PREFERRED EMBODIMENTS

Figure 1:
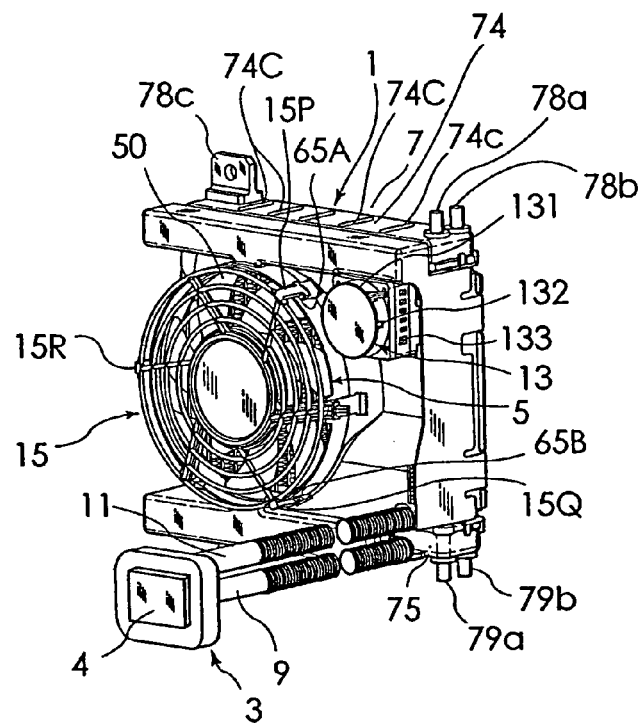
FIG. 1 is a perspective view of one embodiment of the electronic component cooling apparatus according to this invention.
Figure 2:
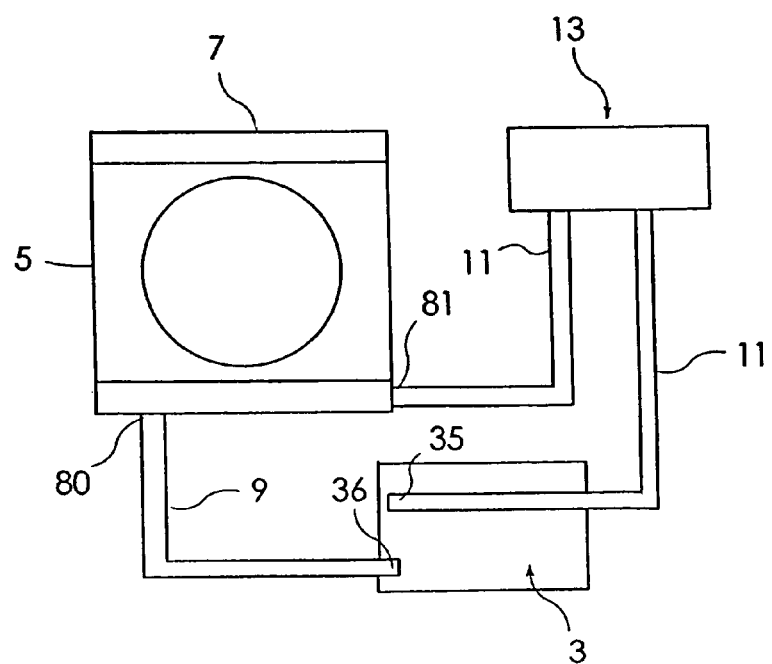
FIG. 2 is a block diagram showing a coolant path configuration in the embodiment of FIG. 1.
Figure 11:
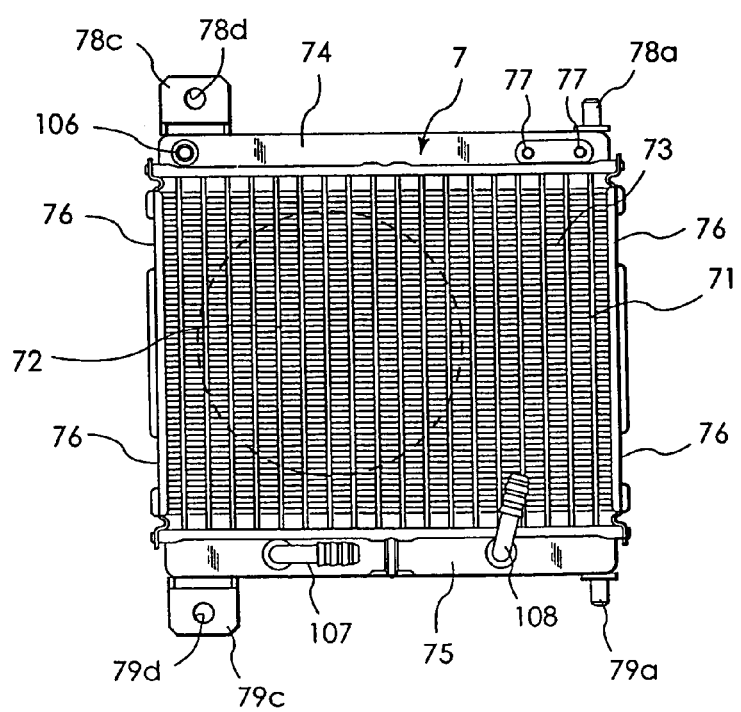
FIG. 11 is a front view of a radiator.

One embodiment of an electronic component cooling apparatus according to this invention will be described in detail by referring to the accompanying drawings. FIG. 1 is a perspective view of one example embodiment of an electronic component cooling apparatus 1 according to this invention. FIG. 2 is a block diagram showing flow paths in this embodiment. FIG. 3 to FIG. 8 are a front view, a rear view, a right side view, a left side view, a plan view and a bottom view of this embodiment. FIG. 9A is a front view of an electric fan 5 and FIG. 9B is a rear view of the same. FIG. 11 and FIG. 12 are a front view and a right side view, respectively, of a radiator.

As shown in FIG. 1 to FIG. 8, this electronic component cooling apparatus 1 includes a water-cooled heat sink 3 having a coolant path therein; a radiator 7 cooled by the electric fan 5; and an electric pump 13 to apply a moving energy to a coolant to circulate the coolant between the heat sink 3 and the radiator 7. As detailed later, the heat sink 3 has an electronic component mounting surface 31a on which an electronic component 4, such as CPU, is mounted to be cooled, a coolant inlet (to which a cylindrical member for tube connection 35 is connected) and a coolant outlet (to which a cylindrical member for tube connection 36 is connected), and a coolant path through which a liquid coolant flows to forcibly cool the electronic component mounting surface. The radiator 7 has a liquid path for a coolant with a coolant inlet 80 and a coolant outlet 81, which is air-cooled to cool the coolant circulating therein. The electric fan 5 is mounted to face a heat-radiating portion of the radiator 7 and has an impeller 51 with a plurality of blades 50. As the impeller 51, rotates, the cooling air is drawn out from the radiator 7 side to cool the radiator 7. A first coolant passage 9 formed of a piping tube connects the coolant outlet 36 of the heat sink 3 to the coolant inlet 80 of the radiator 7. A second coolant passage 11 that has the electric pump 13 installed therein connects the coolant outlet 81 of the radiator 7 to the coolant inlet 35 of the heat sink 3.

The electric pump 13 imparts a moving energy to the coolant so that the coolant coming out of the coolant outlet 81 of the radiator 7 flows into the coolant inlet 35 of the heat sink 3 and that the coolant coming out of the coolant outlet 36 of the heat sink 3 flows into the coolant inlet 80 of the radiator 7.

As shown in FIGS. 9A and 9B, the electric fan 5 has a motor 52 to drive the impeller 51 and a housing 53. The housing 53 has a venturi 54 and a duct-forming wall portion 55. In this embodiment, as shown in FIG. 11, the electric pump 13 is arranged at a position where it opposes that area 73 of a heat-radiating portion 71 of the radiator 7 which is outside an area 72 directly facing the impeller 51. More specifically, in the plan view of FIG. 3 the electric pump 13 is arranged close to an upper right corner of the heat-radiating portion 71 of the radiator 7.

As shown in FIGS. 3-8 and FIGS. 10-12, outer wall portions of an upper tank 74 and a lower tank 75 of the radiator 7 are integrally formed with first mounting fittings and second mounting fittings, which are used to mount the cooling apparatus on a support portion (e.g., a frame of a computer case). The first mounting fittings are pairs of pin-like fittings 78a, 78b and 79a, 79b and the second mounting fittings 78c, 79c have holes 78d, 79d for screws or bolts. The paired pin-like fittings 78a, 78b and the paired pin-like fittings 79a, 79b, both of which constitute the first mounting fittings, are vertically aligned. The second mounting fittings 78c, 79c are also aligned vertically.

Figure 7:
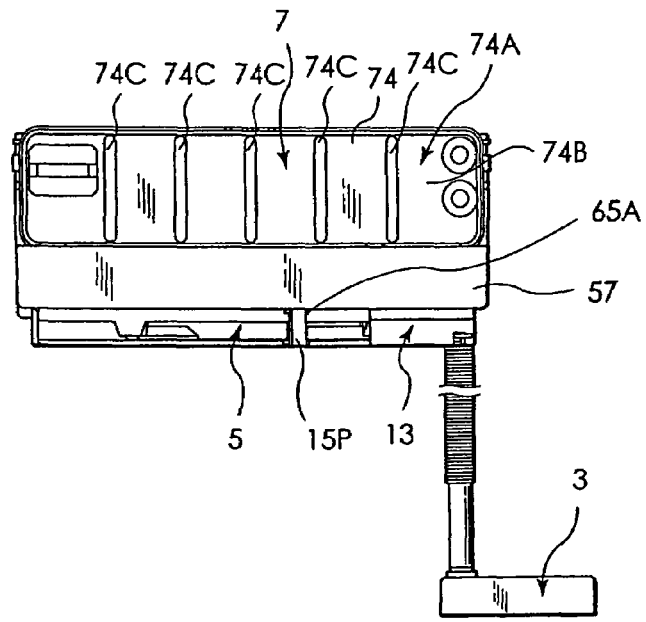
FIG. 7 is a plan view of the embodiment of FIG. 1.
Figure 8:
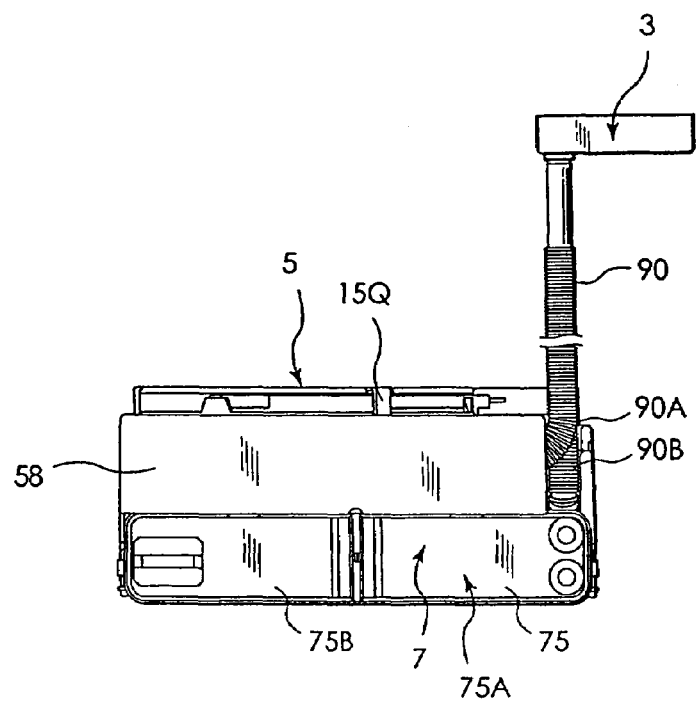
FIG. 8 is a bottom view of the embodiment of FIG. 1.
Figure 9A:
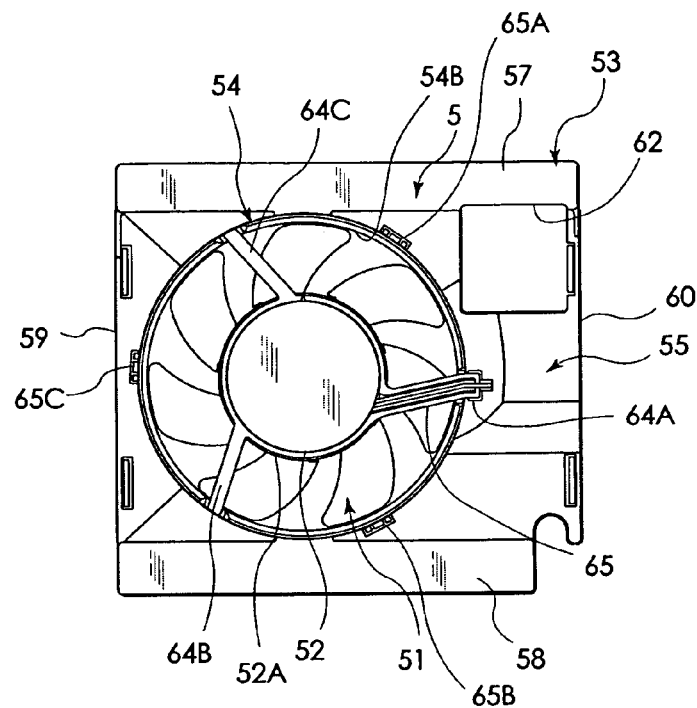
FIG. 9A and FIG. 9B are front and rear views of an electric fan.
Figure 9B:
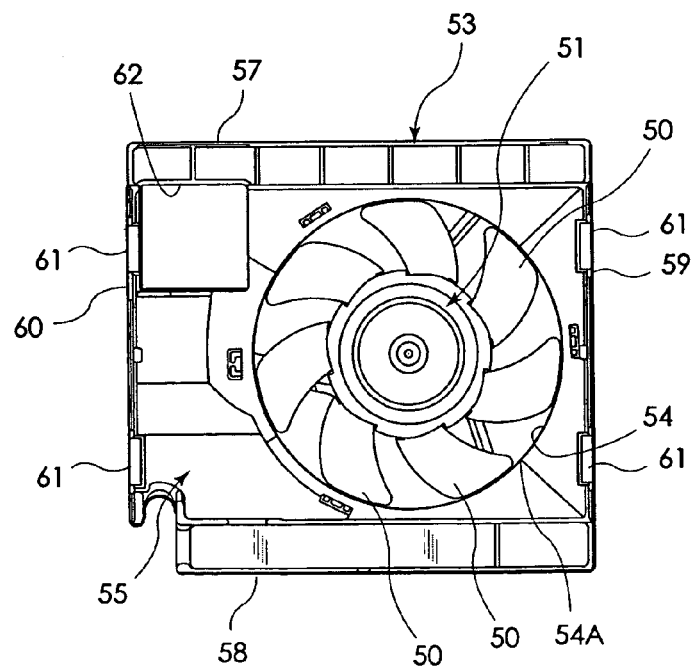

As shown in FIG. 7 and 8, wall portions 74B and 75B have the widest areas among each of the outer wall portion 74A of the upper tank 74 and the other wall portion 75A of the lower tank 75. The wall portions 74B and 75B are integrally formed with reinforcing ribs 74C and 75C which enhance mechanical strength of the outer wall portions 74A and 75A. Each of the reinforcing ribs 74C and 75C extends in each orthogonal direction of each longitudinal direction of the wall portions 74B and 75B. Since these reinforcing ribs 74C and 75C are formed, these ribs 74C and 75C prevent the outer wall portion 74A of the upper tank 74 and the outer wall portion 75A of the lower tank 75 from deforming by fluctuation of the pressure in the radiator and of the volume of the coolant.

Figure 10:
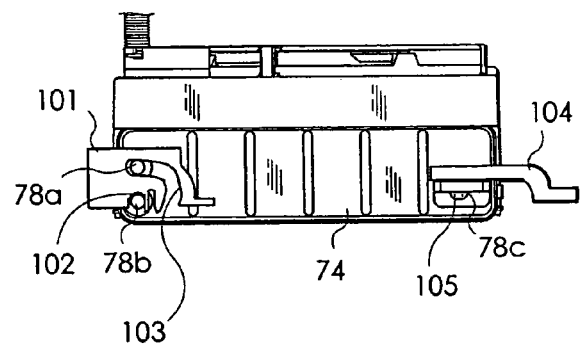
FIG. 10 illustrates the electronic component cooling apparatus in a mounted state.

As shown in FIG. 10, the first mounting fittings made up of paired pin-like fittings 78a, 78b and 79a, 79b are combined with a pair of plastic support portions 101 on the apparatus supporting side (a lower support portion is not shown) to form hinge mechanisms. The support portions 101 are each formed with two grooves 102, 103. The pin-like mounting fitting 78b is fitted into the groove 102 and the pin-like mounting fitting 78a into the groove 103. The pin-like mounting fittings 78a, 79a are slid in the grooves 103 about the pin-like mounting fittings 78b, 79b as a center to cause the radiator 7 to swing. As a result, even after the radiator 7 has been mounted, the electric fan 5 and the electric pump 13 can be inspected and the interior of the apparatus supporting case can be checked and maintained easily. The second mounting fittings 78c, 79c are secured to support portions 104 on the apparatus supporting side by screws 105.

As shown in FIG. 11, a sidewall portion of the upper tank 74 of the radiator 7 are formed with screw holes 77 through which screws are fastened to mount the electric pump 13. The sidewall portion is also formed with a coolant supply port 106. The coolant is poured from the coolant supply port 106 into the upper tank 74 and, after the upper tank 74 is filled, the coolant supply port 106 is closed by fusing. The pressure of the coolant in the coolant circulation system is set lower than an atmospheric pressure so that if the coolant expands to increase its pressure as a result of temperature rise, its pressure will not be much higher than the atmospheric pressure. Thus, if the ambient air temperature increases and the resultant coolant pressure also rises, the coolant circulation system will not be damaged by the coolant pressure.

Figure 5:
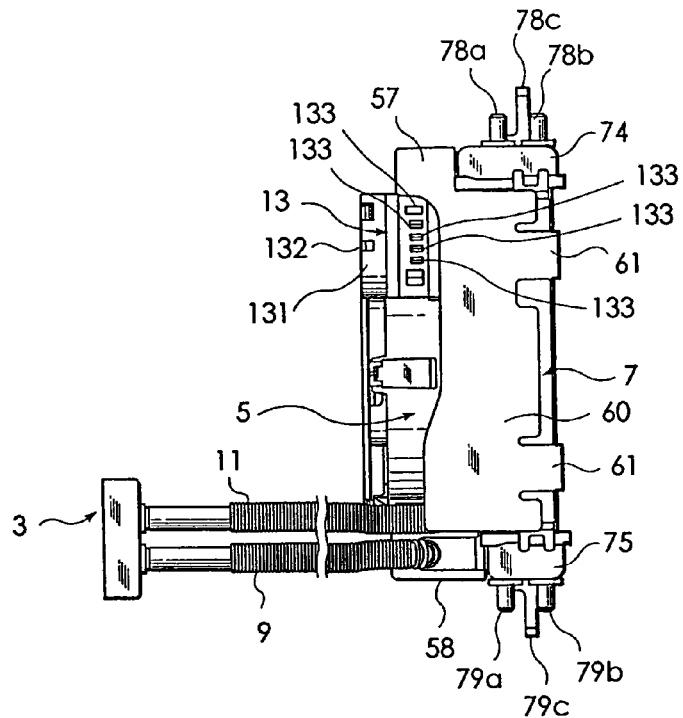
FIG. 5 is a right side view of the embodiment of FIG. 1.
Figure 6:
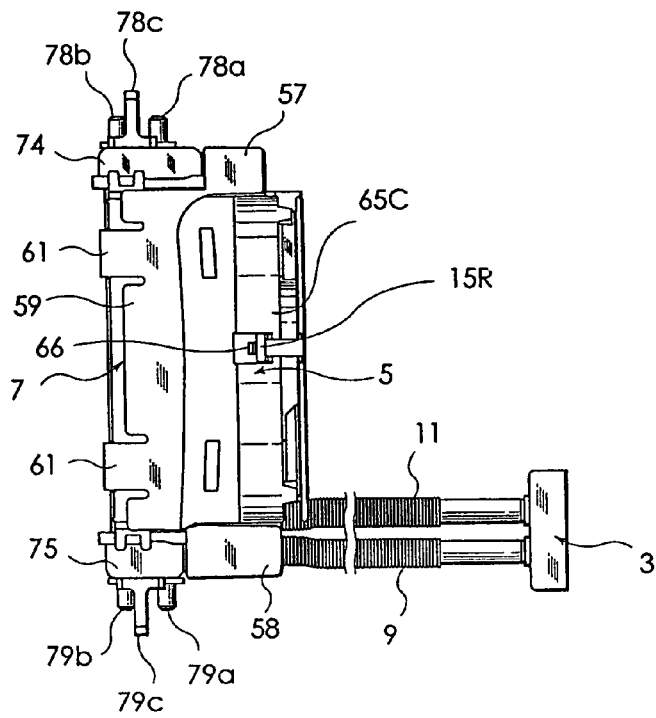
FIG. 6 is a left side view of the embodiment of FIG. 1.
Figure 12A:
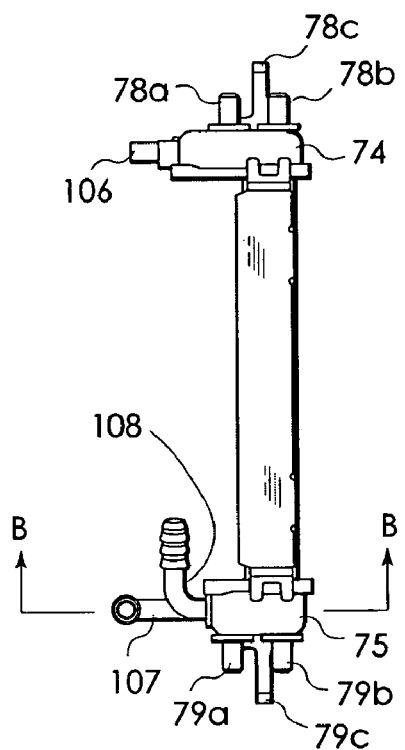
FIG. 12A is a right side view of the radiator and FIG. 12B is a cross-sectional view taken along the line B-B of FIG. 12A.

As shown in FIG. 5, FIG. 6 and FIG. 12A, if a direction from the electric fan 5 toward the radiator 7 is taken to be a thickness direction of the radiator 7, a thickness of the upper tank 74 and the lower tank 75 is set larger than that of the heat-radiating portion 71. This construction allows the upper tank 74 and the lower tank 75 to function as a reserve tank for accommodating a reserve coolant to make up for vaporized coolant. In this embodiment, a capacity of the upper tank 74 is set larger than that of the lower tank 75. More specifically, the volume of the upper tank 74 is set larger than that of the lower tank 75 to form an air space in the upper tank 74 which is compressed when the coolant expands. Such an air space prevents a possible breakage of the radiator that would otherwise result if the inner pressure of the radiator becomes excessively high when the coolant expands due to an ambient temperature rise.

It is preferred that reducing gas is filled in the air space. In this embodiment, nitrogen gas is used as the reducing gas, since the nitrogen gas is inexpensive and readily available. If the nitrogen gas is filled in the air space, the coolant and the inner wall portion of the radiator can restrict their oxidization.

Figure 12B:
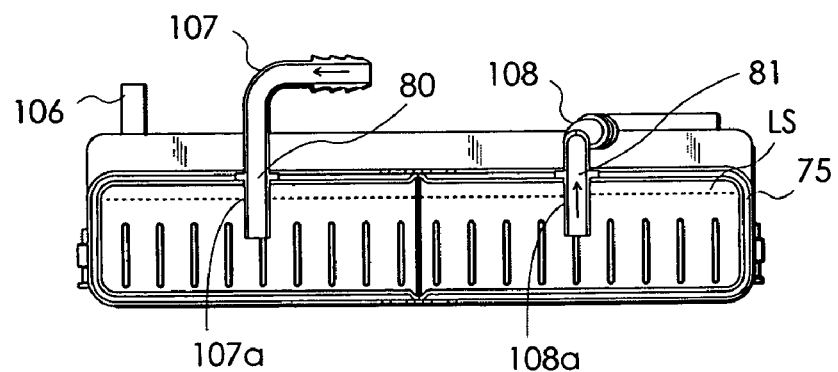
Figure 13:
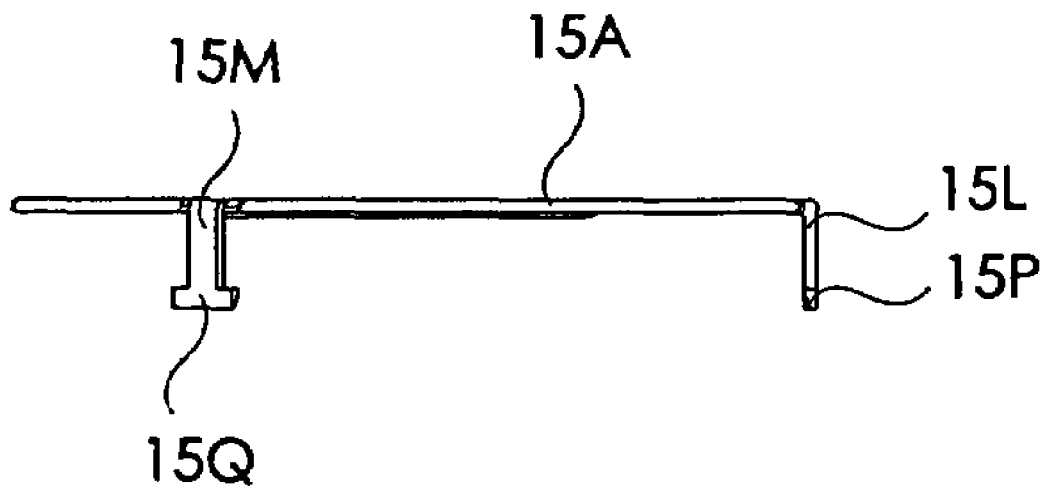
FIG. 13 is a side view of a fan guard.

In FIG. 12B, the coolant inlet 80 of the radiator 7 is attached with a tube connection cylindrical pipe 107 and the coolant outlet 81 with a tube connection cylindrical pipe 108. The tube connection cylindrical pipe 107 has an inlet side extension pipe portion 107a extending from the coolant inlet 80 of the radiator 7 into the lower tank 75. The tube connection cylindrical pipe 108 has an outlet side extension pipe portion 108a extending from the coolant outlet 81 of the radiator 7 into the lower tank 75. The inlet side extension pipe portion 107a and the outlet side extension pipe portion 108a are so arranged that their terminal open ends are always immersed in the coolant whatever attitude the radiator 7 takes. With this arrangement, even if air exists in the lower tank 75 and a liquid surface LS is formed in the lower tank 75, air can be prevented effectively from entering the inlet side extension pipe portion 107a and the outlet side extension pipe portion 108a. This in turn prevents a possible performance degradation of the electric pump 13 which may occur if air is supplied into the electric pump 13. In this embodiment, the terminal open ends of the inlet side extension pipe portion 107a and the outlet side extension pipe portion 108a are terminated around the center of the lower tank 75. The tube connection cylindrical pipes 107, 108 may of course be provided in whichever of the upper tank 74 and lower tank 75 is convenient.

The electric pump 13 is installed so as not to contact the heat-radiating portion 71 of the radiator 7. This positional arrangement minimizes the possibility of the electric pump 13 blocking the flow of cooling air.

In making the most of the function of the radiator 7 to cool the coolant, an idea of putting in front of the heat-radiating portion 71 of the radiator 7 an object that hinders the flow of cooling air drawn by the electric fan 5 from the radiator 7 side is considered undesirable by a person skilled in the art. In this example, however, the electric pump 13 is placed in that part 73 of the front area of the heat-radiating portion 71 of the radiator 7 which does not face the impeller. Although this arrangement may result in a slight reduction in the cooling performance when compared with a case where the electric pump is not put in front of the heat-radiating portion 71, since this arrangement allows the electric pump 13 to be installed inside the planar structure of the radiator 7, an overall size of the electronic component cooling apparatus, which is formed in a planar configuration, can be reduced. To secure a necessary cooling performance, it is clear to a person skilled in the art that the non-impeller-facing area 73 (FIG. 11) of the heat-radiating portion 71 need only be set to an appropriate size.

As shown in FIG. 1 and FIG. 9, the housing 53 of the electric fan 5 has the venturi 54 and the duct-forming wall portion 55. The venturi 54 has a suction port 54A at one end thereof (on the rear side) opposite to the impeller-facing area 72 of the heat-radiating portion 71 of the radiator 7, and a discharge port 54B at the other end (on the front side). The duct-forming wall portion 55 is formed contiguous to the venturi 54 to guide the cooling air drawn out from the non-impeller-facing area 73 of the heat-radiating portion 71 into the suction port 54A.

The housing 53 has cover portions 57, 58 at the top and bottom of the duct-forming wall portion 55 to cover front portions of the upper tank 74 and the lower tank 75 of the radiator 7. Sidewall portions 59, 60 on the left and right side of the duct-forming wall portion 55 have four engaging pieces 61 formed integrally therewith to facilitate the mounting of the electric fan 5 on the radiator 7. The radiator 7 has four locations for engaged portions 76 (see FIG. 11) that are engaged by the four engaging pieces 61 to mount the housing 53 to the radiator 7. With this arrangement the electric fan 5 can be mounted easily to the radiator 7 without using screws. The duct-forming wall portion 55 in the housing 53 allows the cooling air to be drawn out also from the non-impeller-facing area 73 of the heat-radiating portion 71 that does not directly oppose the impeller 51. Thus, the heat-radiating portion 71 of the radiator 7 can be cooled almost entirely.

Figure 3:
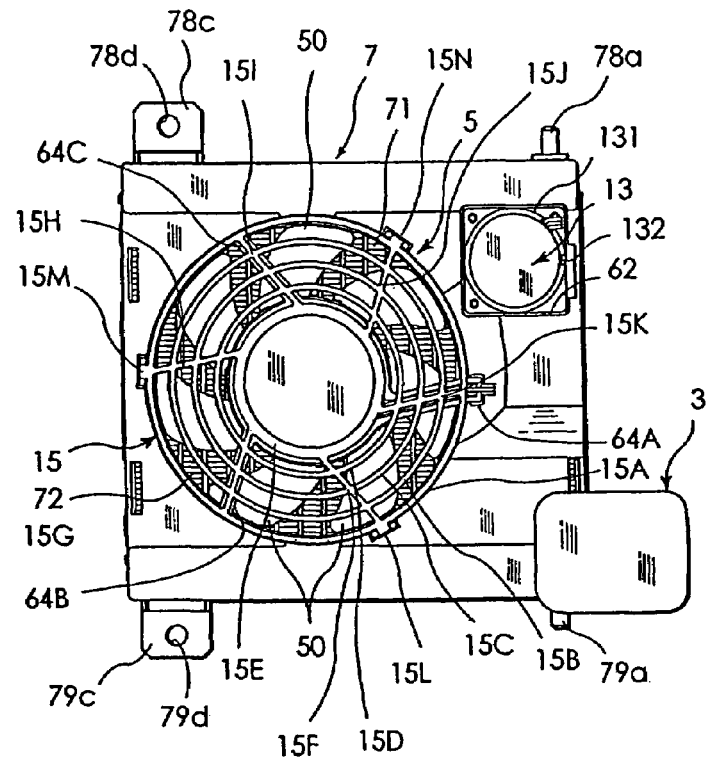
FIG. 3 is a front view of the embodiment of FIG. 1.
Figure 4:
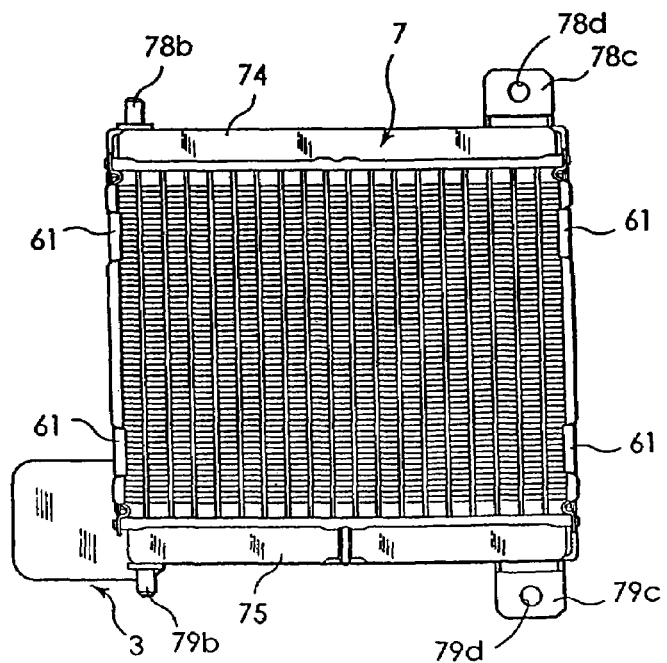
FIG. 4 is a rear view of the embodiment of FIG. 1.

In this embodiment, as shown in FIG. 3 and FIG. 9, the duct-forming wall portion 55 of the housing 53 is formed with an opening 62 to expose heat generating portions including the motor of the electric pump 13. When the electric pump 13 is arranged so that the heat generating portions including the motor of the electric pump 13 are exposed from the opening 62, the heat generated by the electric pump 13 can be released to the outside of the housing 53 of the electric fan 5, thus the heat dissipation performance of the radiator 7 can be protected from adverse influences.

As detailed in FIG. 3, a fan guard 15 is attached to the discharge port 54B of the venturi 54 of the electric fan 5. The fan guard 15 is attached to the venturi 54 with a removable mounting structure. A guard portion of the fan guard 15 has four circular rings 15A-15D, a center circular ring 15E, six connecting ribs 15F-15K, and three legs 15L-15N. The four circular rings 15A-15D are arranged concentric with the center circular ring 15E, and the six connecting ribs 15F-15K extend radially slantwise from the center circular ring 15E. Of the six connecting ribs 15F-15K, three connecting ribs 15K, 15G, 15I are place to meet three webs 64A-64C that connect a casing 52A of the motor 52 of the electric fan 5 with the venturi 54. One of the three webs 64A receives power supply wires 65.

Figure 14A:
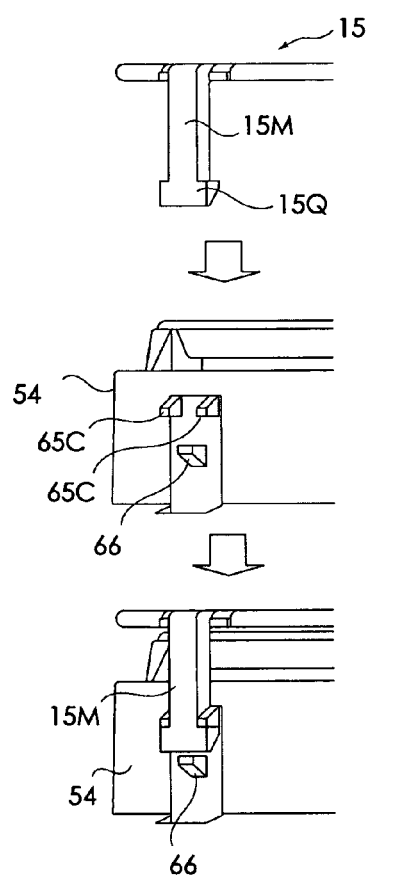
FIG. 14A and FIG. 14B illustrate the fan guard in a mounted state.

The three legs 15L-15N are formed integrally with the outermost circular ring 15A at circumferentially equal intervals. For easy mounting of the fan guard 15 on the venturi 54, an outer circumferential part of the guard portion facing the discharge port 54B (circular ring 15A) is provided with snap-in hooks 15P-15R at the free end of the three legs 15L-15N (see FIG. 1, FIG. 6 to FIG. 8, and FIG. 13 and FIG. 14). An outer circumferential part of the venturi 54 of the electric fan 5 is formed integrally with three engaged portions 65A-65C which the three snap-in hooks 15P-15R engage (see FIG. 1, FIG. 6 and FIG. 7). The engaged portions 65A-65C receive the ends of the hooks 15P-15R through a snap action of the hooks for secure engagement and locking. As shown in FIG. 6 and FIG. 14, the outer circumferential part of the venturi 54 is also formed integrally with stoppers 66 which are provided closer to the housing side than the engaged portions 65A-65C and engage the free ends of the hooks 15P-15R. The stoppers 66 can prevent the hooks from being pushed too much and the guard from being deflected more than necessary and damaged.

Figure 14B:
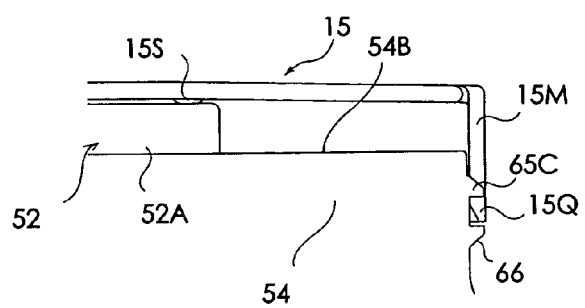

As shown in FIG. 14B, for reliable snap-in connection, the guard portion of the fan guard 15 is provided with an abutment portion 15S that abuts the casing 52A of the motor 52. When the hooks 15P-15R engaged with the engaged portions 65A-65C, the shape and dimension of the abutment portion 15S is so set that the abutment portion 15S abuts the casing 52A and the guard portion is deflected toward the discharge port 54B. This arrangement allows the hooks to be pressed onto the engaged portions strongly, making the snap-in connection reliable.

Figure 15:
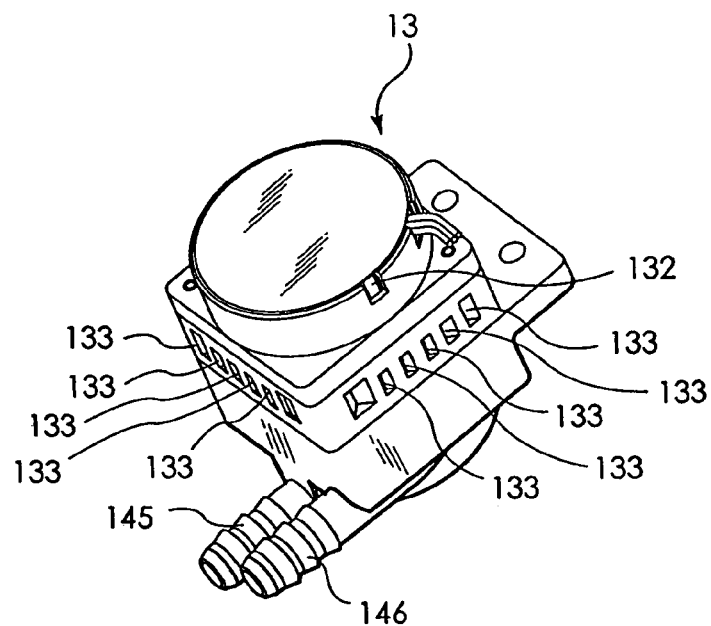
FIG. 15 is a perspective view of an electric pump as seen from the rear.

As shown in FIG. 1, FIG. 3 and FIG. 15, a casing 131 of the electric pump 13 exposed from the opening 62 in the housing 53 of the electric fan 5 may be provided with an operation state indication means (132) to indicate that the electric pump 13 is in operation. The operation state indication means preferably use a light emitting indication means 132 such as a light emitting diode. The light emitting indication means 132 as the operation state indication means makes it possible to check the operation of the electric pump 13 from the outside, which cannot otherwise be seen from the outside like the operation of the electric pump 13, thus facilitating inspection and repair. The light emitting indication means 132 may be turned on when the electric pump 13 is running normally or when an abnormal condition occurs. The casing 131 of the electric pump 13 exposed from the opening 62 is formed with a plurality of heat dissipating through-holes 133 to release to the outside the heat generated by the heat generating portions of the drive motor installed inside (see FIGS. 1, 5, 15 and 16). These heat dissipating through-holes 133, which release most of the heat produced by the electric pump 13 to the outside of the housing 53 of the electric fan 5, can minimize the effects the heat of the electric pump 13 has on the radiator 7.

Figure 16:
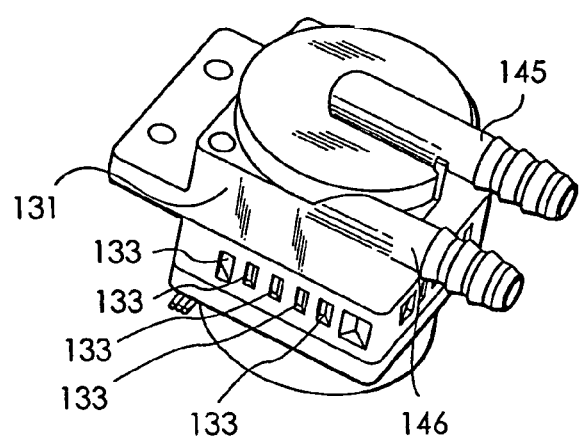
FIG. 16 is a perspective view of the electric pump as seen from the front.
Figure 17:
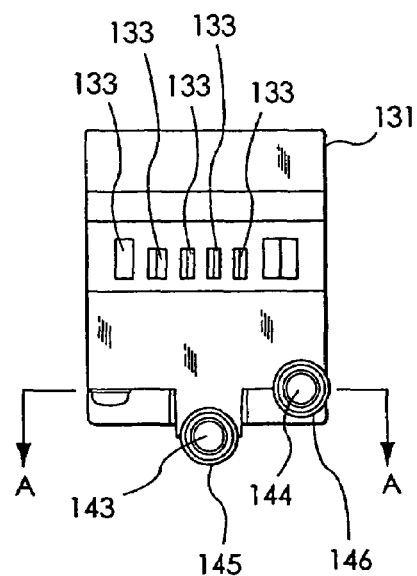
FIG. 17 is a side view of the electric pump.
Figure 18:
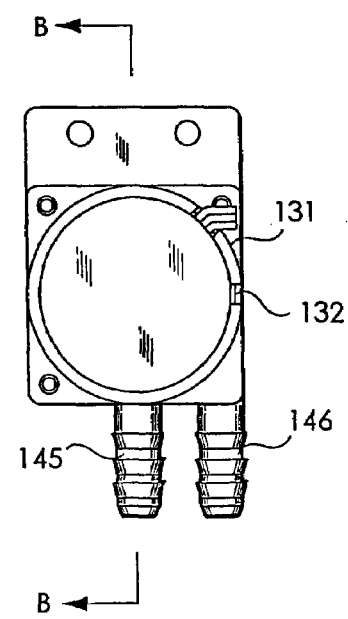
FIG. 18 is a rear view of the electric pump.
Figure 19:
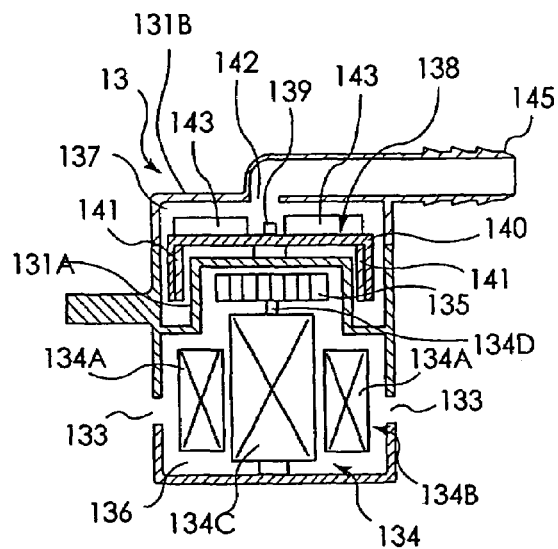
FIG. 19 is a schematic cross-sectional view taken along the line B-B of FIG. 18.
Figure 20:
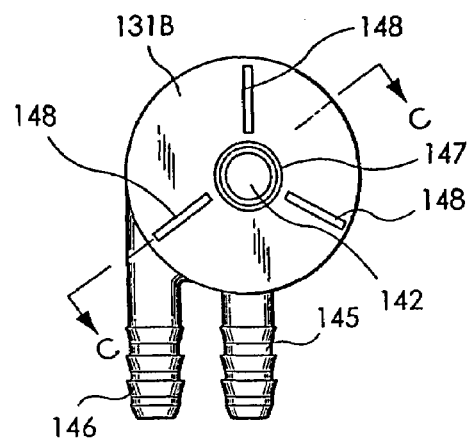
FIG. 20 is a cross-sectional view taken along the line A-A of FIG. 17.
Figure 21:
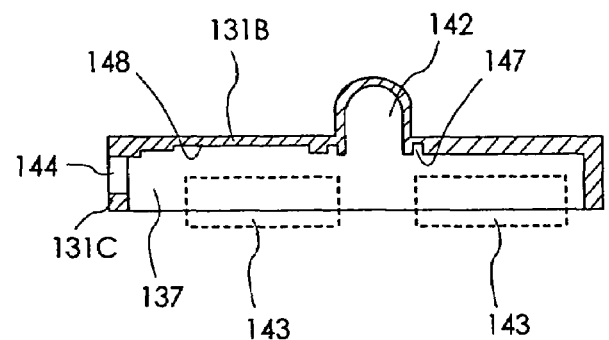
FIG. 21 is a schematic cross-sectional view taken along the line C-C of FIG. 20.

FIG. 15 and FIG. 16 are a perspective view of the electric pump 13 as seen from the rear side and a perspective view as seen from the front side. FIG. 17 and FIG. 18 are a side view and a rear view of the electric pump 13, respectively. FIG. 19 is an outline cross section taken along the line B-B of FIG. 18. In FIG. 19 an inner wall that surrounds an impeller-receiving chamber 137 described later is shown simplified. FIG. 20 is a cross section taken along the line A-A of FIG. 17. FIG. 21 is a cross section taken along the line C-C of FIG. 20. As schematically shown in FIG. 19, a drive motor 134 is installed in the housing 131 of the electric pump 13. The drive motor 134 is a small motor having a stator 134B with an excitation winding 134A and a rotor 134C installed at a center of the stator 134B. An output shaft 134D of the drive motor 134 is attached with a permanent magnet disk 135 having a plurality of drive permanent magnetic poles along the outer circumferential part thereof. The permanent magnet disk 135 is rotated by the drive motor 134. The interior of the housing 131 is divided by a partition wall 131A into a motor accommodation space 136 and an impeller-receiving chamber 137. The outer circumferential part of the housing 131 surrounding the motor accommodation space 136 is formed with the heat dissipating through-holes 133. The heat dissipating through-holes 133 dissipate heat produced by the excitation winding 134A of the drive motor 134.

In the impeller-receiving chamber 137 a pump impeller 138 is rotatably installed. The partition wall 131A is provided with a shaft 139 that protrudes into the impeller-receiving chamber 137 and rotatably supports the pump impeller 138. The pump impeller 138 has a cup member 140 that opens toward the partition wall 131A. The cup member 140 has a plurality of permanent magnetic poles 141 securely fixed to an inner circumferential surface of a circumferential wall portion thereof so that they oppose the permanent magnet disk 135 driven by the drive motor 134 through the partition wall 131A. The cup member 140 also has a plurality of blades 143 formed integrally with an outer surface of a disk-shaped wall portion thereof, and the blades are radially arranged around an axis of the shaft 139 as a center. This arrangement enables the pump impeller 138 to be rotated by a magnetic attraction between the drive permanent magnetic poles of the permanent magnet disk 135 and the permanent magnetic poles 141 of the pump impeller 138. This construction allows the drive motor 134 of the electric pump 13 to be water-proofed easily.

The housing 131 has a liquid inlet 142 and a liquid outlet 144 (FIG. 19 and FIG. 21). The liquid inlet 142 and liquid outlet 144 are integrally formed with tube connection cylindrical pipes 145, 146 to which coolant circulation tubes are connected (FIG. 21). These tube connection cylindrical pipes 145, 146 have a plurality of annular raised portions formed integrally with the outer circumference thereof to prevent the connected tubes from coming off. The impeller-receiving chamber 137 is so constructed that the pump impeller 138 is immersed in the coolant and the rotation of the pump impeller 138 draws in the coolant at the liquid inlet 142 and delivers it from the liquid outlet 144. The impeller-receiving chamber 137 is surrounded by its two wall portions 131B, 131C. The liquid inlet 142 is formed in the wall portion 131B facing the blades 143 and is positioned on an extension of the axis of the shaft 139. As shown in FIG. 21, the liquid outlet 144 is formed in the wall portion (circumferential wall portion) 131C at a position perpendicular to the axis of the shaft 139.

In the electric pump 13 of this embodiment, as shown in FIG. 20 and FIG. 21, the wall portion 131B having the liquid inlet 142 is also formed with an annular groove 147 and three narrow grooves 148. The annular groove 147 surrounds the liquid inlet 142 completely and opens toward the pump impeller 138. The three narrow grooves 148 are formed outside the annular groove 147 so as not to connect to the annular groove 147. The narrow grooves 148 are arranged to extend radially around the axis of the shaft 139 as a center and open toward the pump impeller 138. The shapes and dimensions of the annular groove 147 and the three narrow grooves 148 are determined such that dirt and air bubbles entering from the liquid inlet 142 into the impeller-receiving chamber 137 are crushed between the blades 143 and edges of the annular groove 147 and narrow grooves 148, and moved radially outwardly along the narrow grooves by a centrifugal force for discharging from the liquid outlet 144. These grooves 147, 148 can effectively prevent a possible degradation of pump performance that would otherwise be caused by dirt and air bubbles in the impeller-receiving chamber 137. The narrow grooves 148 are preferably formed at circumferentially equal intervals. This arrangement eliminates a possibility of the presence of the narrow grooves 148 causing variations in the rotation of the pump impeller 138.

Figure 22:
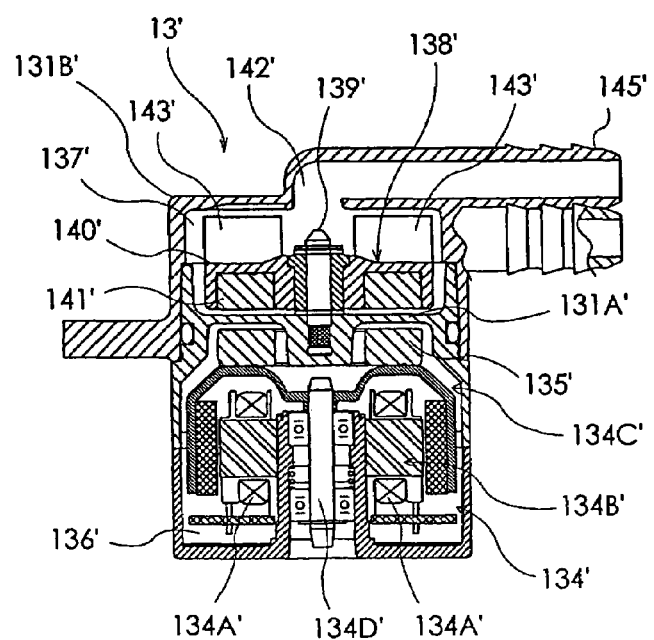
FIG. 22 is a vertical cross-sectional view of another electric pump.
Figure 23:
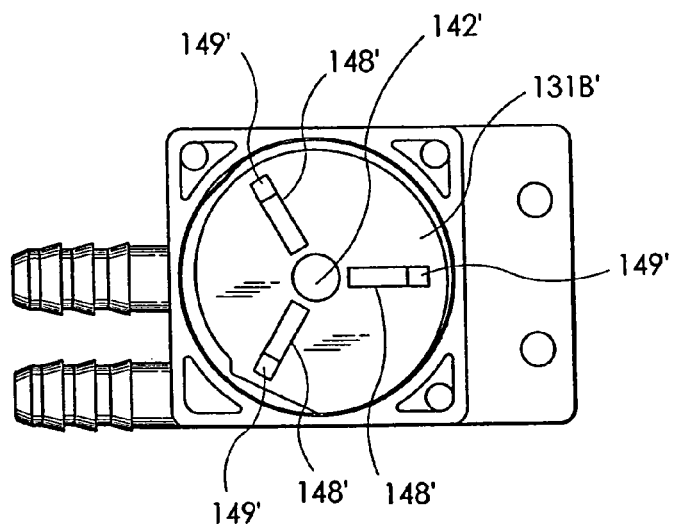
FIG. 23 illustrates a construction of a wall portion of the electric pump formed with a liquid inlet.
Figure 24:
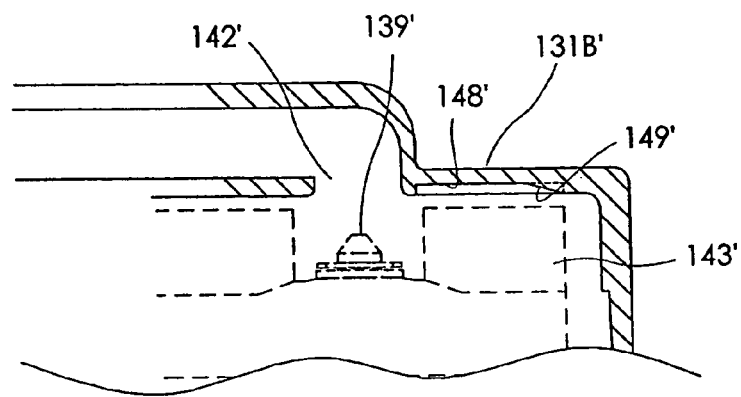
FIG. 24 is an enlarged cross-sectional view of an essential part of FIG. 23.

FIG. 22 is a vertical cross-sectional view of another example of an electric pump 13'. Parts identical in construction with those shown in FIGS. 19-21 are assigned like reference numbers attached with a prime. The electric pump 13' shown in FIG. 22 differs from the electric pump 13 described above in that a drive motor 134' is an outer rotor type permanent magnet motor in which a rotor 134C' rotates outside a stator 134B', that a permanent magnet disk 135' is mounted on the cup of the rotor 134C', that permanent magnetic poles 141' are arranged inside a cup-shaped member 140' to oppose the permanent magnet disk 135' in a direction of a rotating shaft 134D' of the drive motor 134', and that a wall portion 131B' formed with a liquid inlet 142' is not formed with the annular groove 147. As shown in FIG. 23 and FIG. 24, the wall portion 131B' is formed with three narrow grooves 148' that are radially arranged around the liquid inlet 142' so as not to connect with the liquid inlet 142'. One surface 149' of the wall surfaces surrounding each narrow groove 148', which is positioned radially outwardly, gradually inclines toward the wall 131B'. This inclined surface ensures that bubbles and dirt that are moved radially outwardly by the centrifugal force can be smoothly discharged from the narrow groove without being caught at edges of the groove. When compared with a construction in which one of the surfaces 149' does not incline, this arrangement has little loss when the impeller 138' is rotated, and reduce power consumption. The narrow groove 148 in the electric pump 13 shown in FIG. 19 to FIG. 21 may also be formed with the similar inclined surfaces.

Figure 25:
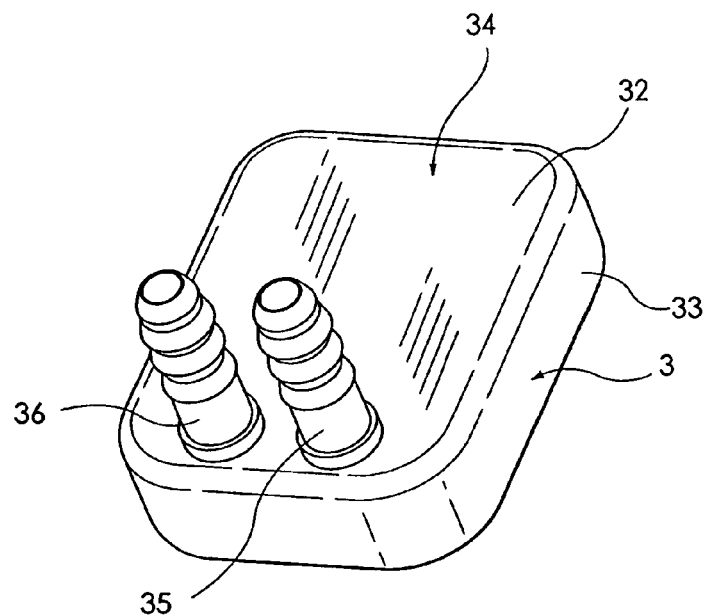
FIG. 25 is a perspective view of a heat sink.
Figure 26:
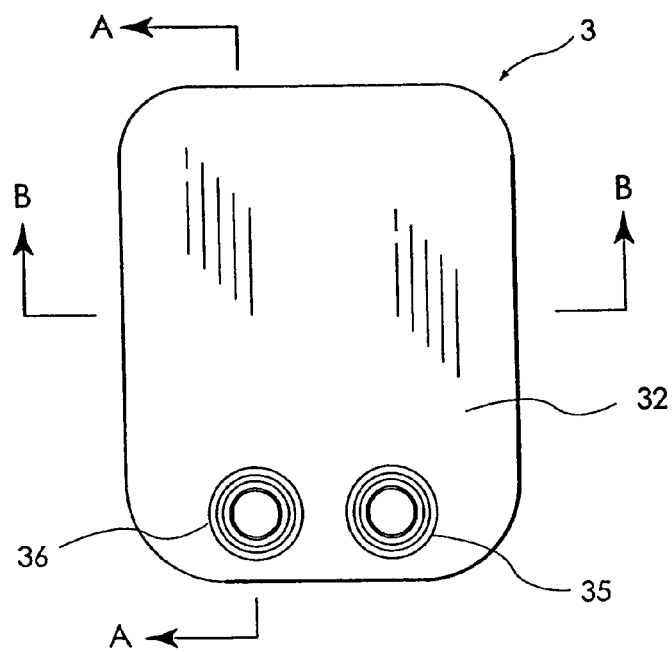
FIG. 26 is a plan view of the heat sink.
Figure 27:
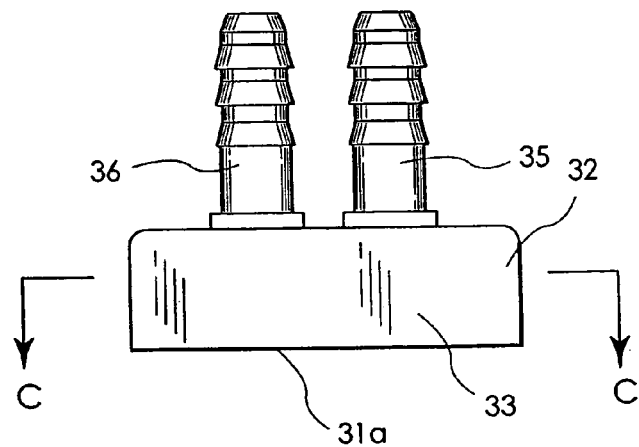
FIG. 27 is a front view of the heat sink.
Figure 28:
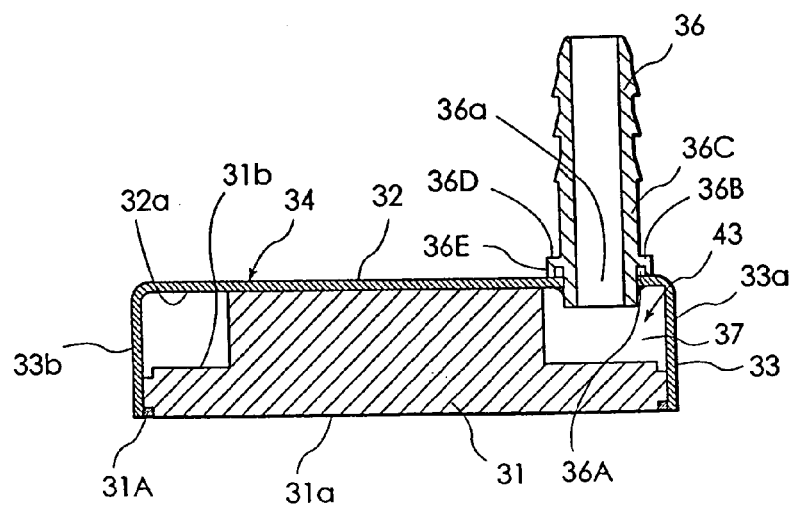
FIG. 28 is a cross-sectional view taken along the line A-A of FIG. 26.
Figure 29:
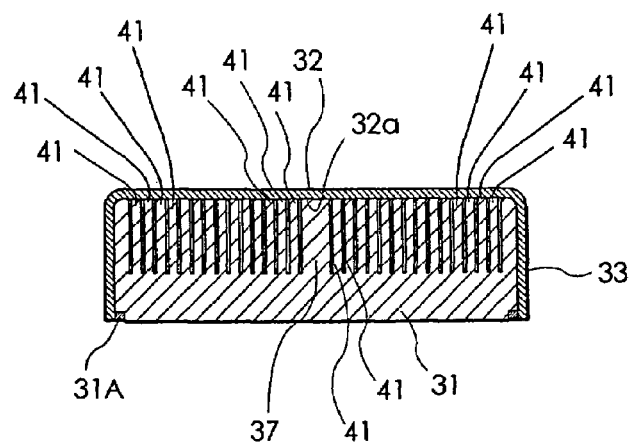
FIG. 29 is a cross-sectional view taken along the line B-B of FIG. 26.
Figure 30:
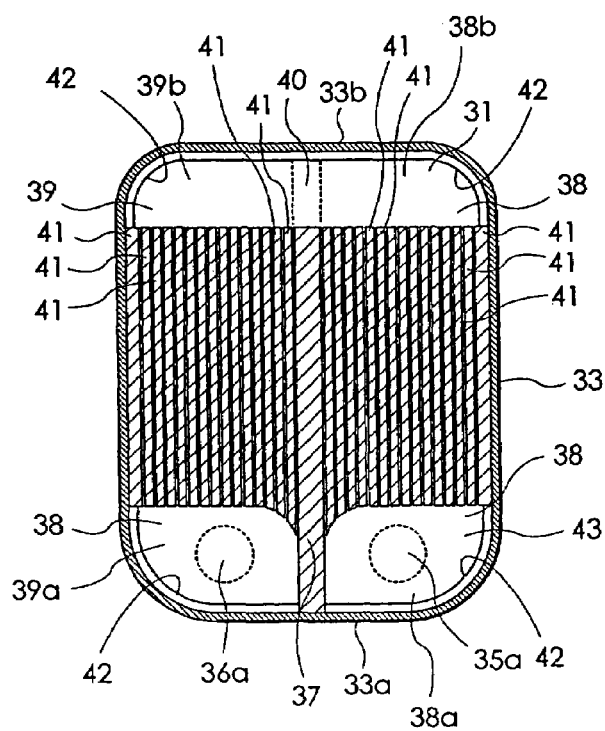
FIG. 30 is a cross-sectional view taken along the line C-C of FIG. 27.

FIG. 25 shows a perspective view of the heat sink 3, and FIG. 26 and FIG. 27 are a plan view and a front view of the heat sink 3. FIG. 28 is a cross section taken along the line A-A of FIG. 26, FIG. 29 is a cross section taken along the line B-B of FIG. 26, and FIG. 30 is a cross section taken along the line C-C of FIG. 27. The heat sink 3 has a coolant path therein and comprises a base plate 31 and a top plate case 34 having a top plate 32 and a circumferential wall portion 33. The base plate 31 has an electronic component mounting surface 31a and a heat-radiating surface 31b which opposes the electronic component mounting surface 31a in the thickness direction and directly contacts the coolant. The base plate 31 is formed in one piece of a metal with high thermal conductivity, such as copper and aluminum. The top plate case 34 may be formed of a metal with high thermal conductivity, such as copper and aluminum, like the base plate 31. It may also be formed of a synthetic resin material. The top plate case 34 is provided with a tube connection cylindrical pipe 35 connected to a coolant inlet 35a and with a tube connection cylindrical pipe 36 connected to a coolant inlet 36a.

The top plate 32 has a surface 32a that opposes the heat-radiating surface 31b of the base plate 31, with a predetermined gap therebetween. The circumferential wall portion 33 connects the base plate 31 and the top plate 32 to form a chamber 43 (FIG. 30) between the base plate 31 and the top plate 32. The heat sink 3 has a partition wall portion 37 (FIG. 28 to FIG. 30) that divides the chamber 43. The partition wall portion 37 connects to or is in tight contact with one (33a) of paired, opposing circumferential wall constituent parts 33a, 33b and extends toward the other circumferential wall constituent part (33b). It may be connected to the circumferential wall constituent part as by bonding or fusing. For tight contact, a press contact technique or tight fitting technique may be used. The partition wall portion 37 divides the interior of the chamber 43 into first and second sub-chambers 38, 39 on both sides of the partition wall portion 37. Between the partition wall portion 37 and the second circumferential wall constituent part 33b, there is formed a communicating passage 40 to communicate the first and second sub-chambers 38, 39 with each other. The coolant inlet 35a of the heat sink 3 communicates with a first chamber part region 38a situated opposite side of the communicating passage 40 of the first sub-chamber 38. The coolant outlet 36a of the heat sink 3 communicates with a fourth chamber part region 39a of the second sub-chamber 39 situated on a side opposite to the communicating passage 40. Because in this arrangement the coolant inlet 35a and the coolant outlet 36a of the heat sink 3 are situated close to each other, connection of piping to the heat sink 3 is easily accomplished and the piping poses little hindrance to mounting a heat sink 3. In the first and second sub-chambers 38, 39 a plurality of plate-like radiation fins 41 are arranged in a manner that heat can be transferred to at least the base plate and the flow of coolant is not blocked. The coolant that enters the first sub-chamber 38 from the coolant inlet 35a comes into contact with the radiation fins 41 in the first sub-chamber 38, passes through the second chamber part region 38b of the first sub-chamber 38 and the communicating passage 40, enters the third chamber part region 39b of the second sub-chamber 39, contacts the radiation fins 41 in the second sub-chamber 39, and then enters the fourth chamber part region 39a before being discharged from the coolant outlet 36a. This construction improves the cooling performance without increasing the size of the heat sink. The reason for this is that since a ratio of the widths of the first sub-chamber 38 and the second sub-chamber 39 to the diameters of the coolant inlet 35a and the coolant outlet 36a is not so large, there is no significant difference in the flow velocity and flow rate among the coolant flowing through gaps between the radiation fins 41 in the first sub-chamber 38 and the coolant flowing through gaps between the radiation fins 41 in the second sub-chamber 39, thus assuring a smooth and efficient transfer of heat from the radiation fins 41 to the coolant. As a result, the cooling performance can be enhanced without having to increase the size of the heat sink 3.

In this example, the radiation fins used in this invention are comprised of a plurality of plate-like radiation fins 41 extending along the partition wall portion 37. In this arrangement, between adjacent plate-like radiation fins 41 is formed a gap through which the coolant flows. The thickness of each radiation fin 41 and their intervals need only be set to produce a necessary cooling performance. The base plate 31, the partition wall portion 37 and the plate-like radiation fins 41 can be formed in one piece. In that case, upper ends of the partition wall portion 37 and the radiation fins 41 are placed in tight contact with or connected to the top plate 32. For secure connection, a bonding or fusing technique may be used. For tight contact, a press contact technique or close fitting technique may be used. With this arrangement, the coolant does not flow between the upper ends of the radiation fins 41 and the top plate 32, so the coolant flow is restricted to through gaps only between the radiation fins. As a result, a reduction in heat transfer from the radiation fins to the coolant is efficiently prevented, thus enhancing the cooling performance.

In this example, the coolant inlet 35a and the coolant outlet 36a of the heat sink 3 are formed in the top plate 32. With this arrangement, connection of piping to the heat sink 3 is easily accomplished and the presence of piping poses little hindrance to fixedly mounting the heat sink 3.

In this example, a plurality of the plate-like radiation fins 41 are arranged in an area in the chamber 43 other than the first chamber part region 38a, the second chamber part region 38b, the third chamber part region 39b connected to the second chamber part region 38b having the communicating passage 40 therebetween, and the fourth chamber part region 39a. Increasing the volume the radiation fins occupy in the chamber 43 more than necessary, however, results in a reduced flow velocity of the coolant,-and thereby a degraded cooling performance.

Those inner wall surface portions 42 of the circumferential wall portion 33 that surround the four corners of the chamber 43 have smoothly curved surfaces with no sharp edges. This arrangement can reduce a flow resistance at the corners of the chamber 43, preventing an undesired fall of flow speed.

The tube connection cylindrical pipes 35, 36 are connected, by soldering or brazing, to the coolant inlet 35a and the coolant outlet 36a formed in the top plate 32. The tube connection cylindrical pipe 36 shown in FIG. 28 is taken as an example in the following explanation. The tube connection cylindrical pipe 36 has a flange 36B formed integrally with an outer circumferential part of a base portion thereof protruding outside from the top plate 32. The flange 36B forms an annular space 36A to receive a metal melted by soldering or brazing that leaks from the coolant outlet 36a to the surface side of the top plate 32. The flange 36B comprises an annular disk portion 36D integrally secured to an outer circumferential part of a cylindrical body 36C and extending radially outwardly, and a cylindrical portion 36E extending from the free end of the disk portion 36D along the cylindrical body 36C.

When the flange 36B is provided to the tube connection cylindrical pipe 36 as described above, the melted metal soldered or brazed between a back surface of the top plate 32 and an outer circumferential surface of the base portion of the cylindrical body 36C of the tube connection cylindrical pipe 36 can be prevented from being seen from the outside if it leaks out to the surface side of the top plate 32. The top plate 32 and the base plate 31 are secured together by a solder or brazing material filled in a step portion 31A formed in an outer circumferential part of the base plate 31. Plating, painting and shot blasting the outer surface of the heat sink can improve its appearance.

Figure 31:
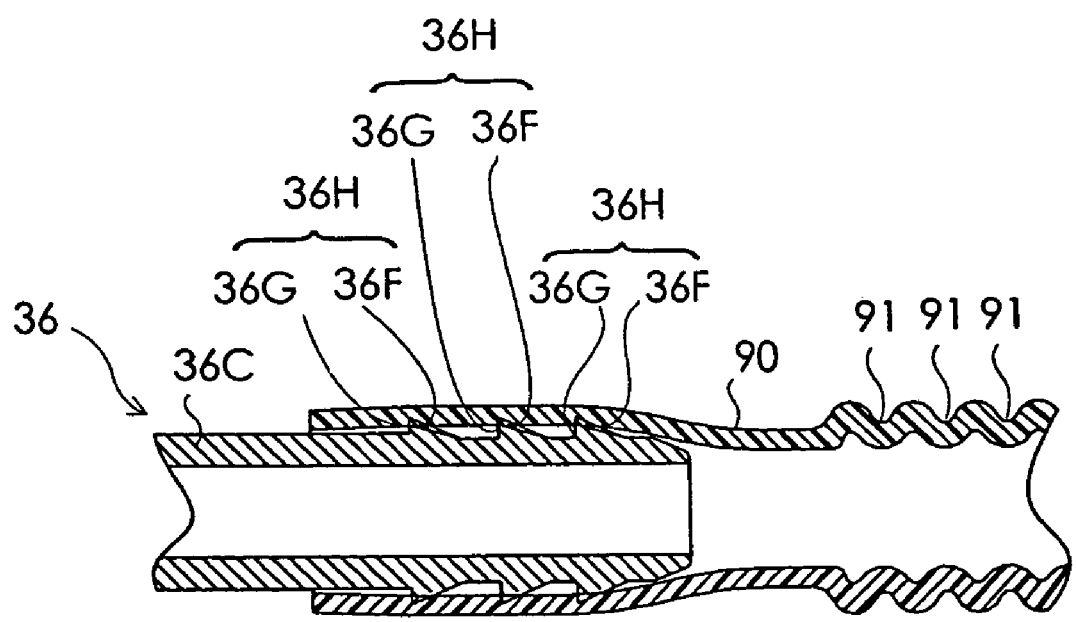
FIG. 31 is an enlarged cross-sectional view of a tube connection cylindrical pipe connected with a tube.
Figure 32A:
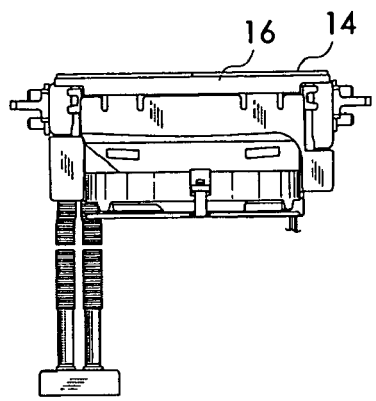
FIGS. 32A to 32F are a top view, a front view, a left side view, a right side view, a bottom view and a rear view of the electronic component cooling apparatus attached with a gasket.
Figure 32B:
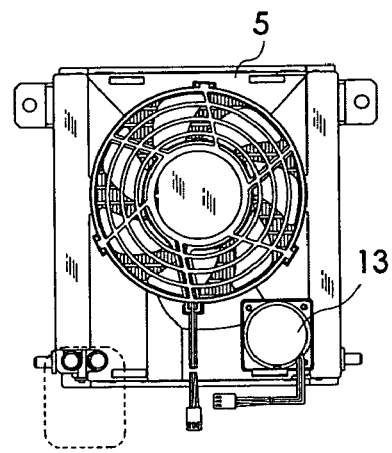
Figure 32C:
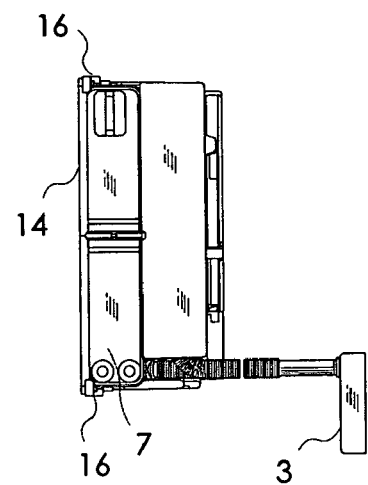
Figure 32D:
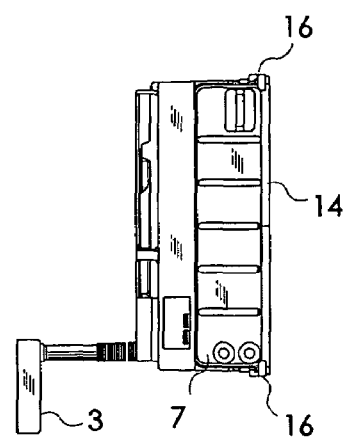
Figure 32E:
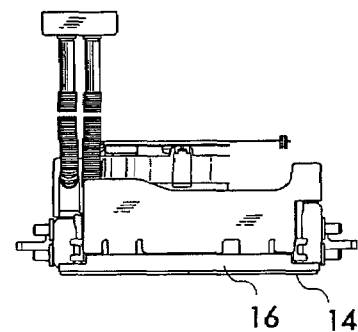
Figure 32F:
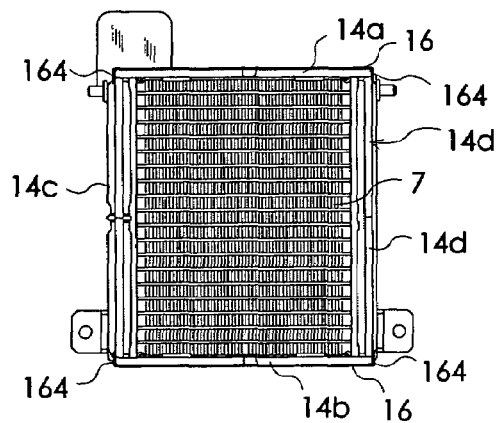

FIG. 31 is an enlarged cross-sectional view of a tube connection cylindrical pipe used in the heat sink 3, the radiator 7 and the electric pump 13 (a tube connection cylindrical pipe 36 of the heat sink 3 is shown as a representative), the end portion of which has a tube 90 fitted thereover. The end portion of the tube connection cylindrical pipe 36 has three edge-forming projections 36H formed integrally with the outer circumferential part thereof. Each of the edge-forming projections 36H has a inclined surface 36F increasing in diameter from the front end side toward the base portion side and an edge-forming surface 36G extending from a tip of the inclined surface 36F toward the cylindrical body 36C to form an edge that bites into an inner wall of the tube between the inclined surfaces 36F. As the tube 90 is fitted over the end portion of the tube connection cylindrical pipe 36, the edges of the edge-forming projections 36H bite into the inner wall of the tube 90, securely locking the tube 90. Since the edges of the edge-forming projections of the tube connection cylindrical pipe bite into the inner wall of the tube, no gaps are formed between them, significantly reducing liquid leakage or liquid evaporation through the connected portion.

The tube is preferably formed of a material which has high heat resistance, chemical resistance and weatherability and which has little flexibility and elasticity. At present a preferable tube 90 is a plastic tube which in this embodiment is formed of fluororesin. The fluororesin used desirably has a low permeability to water so that the coolant can be prevented from passing through the tube wall, and therefore the coolant volume from decreasing. A main part of the tube 90 has formed in its outer circumferential part a spiral groove 91 extending longitudinally of the tube 90 or bellows-like grooves 91. This arrangement facilitate a tube bending during the heat sink mounting process if the tube has little flexibility or elasticity. As shown in FIG. 8, the bended portions 90A and 90B of the tube 90 may be bended by forming technique before the tube is mounted in the apparatus. If the tube is bended by forming technique before mounted, the tube does not have to be forcibly bended when mounted. Consequently-the tube can avoid the reduction of its cooling performance which is caused by an extreme decrease of a cross-sectional area of the tube at a bended portion. Additionally, if the tube is bended by forming technique before mounted, a restoring force is not generated in the tube. Therefore the tube and surrounding components such as an electricity substrate in the system can avoid interfering each other.

Figure 33A:
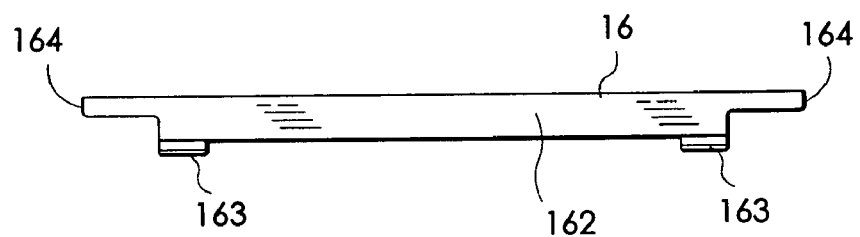
FIGS. 33A to 33C are a front view and a right side view of a gasket holder and a cross-sectional view showing how the gasket holder works.
Figure 33B:
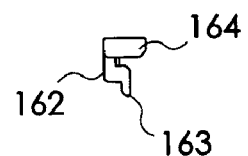
Figure 33C:
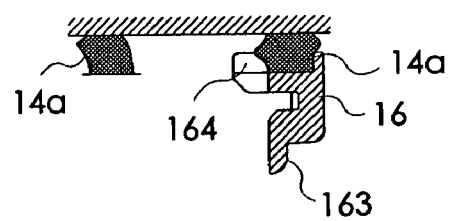

FIG. 32A to FIG. 32F are a top view, a front view, left side view, a right side view, a bottom view and a back view of the electronic component cooling apparatus in which a gasket 14 of an elastic material such as sponge and rubber is attached to a peripheral portion of the surface of the radiator 7 situated on the side not facing the electric fan 5. The gasket 14 is comprised of four linear gasket members 14a-14d. Both left and right sides of the radiator 7 are attached with gasket holders 16 that support the gasket members 14a, 14b respectively. FIGS. 33A and 33B are a front view and a right side view of the gasket holder 16. FIG. 33C is a cross section showing how the gasket member 14a is deformed when the gasket holder 16 is not used and when it is used. The gasket holders 16 support the gasket members 14a, 14b, which constitute a part of the gasket 14, so that they are kept out of contact with the heat-radiating portion 71. The gasket holders 16 also restrict the deformation of the gasket members 14a, 14b so that the gasket members 14a, 14b, when pressed against a support portion, can be brought into stable and tight contact with the support portion. The gasket holders 16 each comprise a holder body 162 having a support surface 161 that supports the gasket member 14a or 14b and two mounting hooks 163 formed integrally with the holder body 162. The mounting hooks 163 are locked to side portions of the heat-radiating portion 71 of the radiator 7. The holder body 162 has extension portions 164 at both ends thereof, which extend along those end portions of the gasket members 14c, 14d mounted on the outer surface of the upper tank 74 and the lower tank 75, and restrict the deformation of the gasket members 14c, 14d.

In this embodiment, the two gasket holders 16 form a gasket support member. As shown in FIG. 33C, the use of the gasket support member ensures that the gasket 14 can always be deformed stably without mounting the gasket 14 at positions where the cooling performance of the radiator 7 is not be affected. This in turn prevents a degradation of sealing performance. Since the gasket holders 16 are removably mounted on the radiator 7, the gasket holders 16 do not have to be mounted when the gasket is not needed.

In this embodiment, not shown, the upper tank 74 and the lower tank 75 may be mounted with additional inlets for the coolant into the radiator 7. It is preferred that the tank 74 or 75 is integrally mounted with a tube portion as an inlet for the coolant. After the coolant is supplied through the tube portion, an edge of the tube is sealed by welding. With this arrangement, the coolant can avoid leaking through the inlet. If the inlet for the coolant is mounted, the coolant can be supplied after the tube is completely connected, which can facilitate construction. It is of course preferred that a pump or a heat sink may be mounted with inlets for the coolant.

Further, the present invention is not limited to these embodiments, but various variations and modifications may be made without departing from the scope of the present invention.

What is claimed is:

1. An electronic component cooling apparatus comprising:
a heat sink having an electronic component mounting surface on which an electronic component to be cooled is mounted, a coolant inlet and a coolant outlet, and a coolant path in which a liquid as a coolant flows to forcibly cool the electronic component mounting surface;
a radiator having a coolant inlet and a coolant outlet and a liquid path in which the coolant flows, the liquid path being air-cooled to cool the coolant;
an electric fan mounted on a heat-radiating portion of the radiator to generate a cooling air flow by a rotation of an impeller having a plurality of blades in order to cool the heat-radiating portion of the radiator;
an electric pump to supply a moving energy to the coolant so that the coolant coming out of the coolant outlet of the radiator to the coolant inlet of the heat sink and to supply the coolant from the coolant outlet of the heat sink to the coolant inlet of the radiator;
wherein the heat-radiating portion of the radiator has an impeller-facing area facing the impeller and a non-impeller-facing area which is different from the impeller-facing area and does not face the impeller;
wherein the electric pump is arranged at a position opposing the non-impeller-facing area;
wherein the electric fan has a housing which comprises a motor driving the impeller, a venturi having at one end thereof a suction port opposite to the impeller-facing area of the heat-radiating portion of the radiator and a discharge port at the other end, and a duct-forming wall portion formed contiguous to the venturi to lead air coming out of the non-impeller-facing area of the heat-radiating portion to the suction port;
wherein the duct-forming wall portion is formed with an opening to expose a heat generating portion of the electric pump; and
wherein the casing of the electric pump exposed from the opening is formed with a plurality of heat dissipating through-holes to dissipate to the outside heat generated by the heat-generating portion of a drive motor installed in the electric pump.

2. The electronic component cooling apparatus according to claim 1, wherein the electric pump is adjoined to one corner of the heat-radiating portion.

3. The electronic component cooling apparatus according to claim 1, wherein the housing has a plurality of engaging pieces formed integrally therewith;
wherein the radiator has a plurality of engaged portions that are engaged by the engaging pieces to mount the housing to the radiator.

4. The electronic component cooling apparatus according to claim 1, wherein a casing of the electric pump exposed from the opening is provided with an operation status indication means indicating that the electric pump is running.

5. The electronic component cooling apparatus according to claim 1, wherein the discharge port of the venturi of the electric fan is attached with a fan guard with a removable mounting structure.

6. The electronic component cooling apparatus according to claim 5, wherein the fan guard has a guard portion facing the discharge port and a plurality of snap-in hooks arranged at circumferentially equal intervals on an outer circumferential part of the guard portion;
wherein an outer circumferential part of the venturi of the electric fan has a plurality of engaged portions integrally formed therewith to which the hooks are snap-in-connected;
wherein the mounting structure is constructed of the plurality of hooks and the plurality of engaged portions.

7. The electronic component cooling apparatus according to claim 6, wherein the outer circumferential part of the venturi of the electric fan is formed integrally with a plurality of stopper portions on which free ends of the plurality of hooks may abut, the hooks being snap-in-connected with the plurality of engaged portions.

8. An electronic component cooling apparatus comprising:
a heat sink having an electronic component mounting surface on which an electronic component to be cooled is mounted, a coolant inlet and a coolant outlet, and a coolant path in which a liquid as a coolant flows to forcibly cool the electronic component mounting surface;

a radiator having a coolant inlet and a coolant outlet and a liquid path in which the coolant flows, the liquid path being air-cooled to cool the coolant;

an electric fan mounted on a heat-radiating portion of the radiator to generate a cooling air flow by a rotation of an impeller having a plurality of blades in order to cool the heat-radiating portion of the radiator; and an electric pump to supply a moving energy to the coolant so that the coolant coming out of the coolant outlet of the radiator to the coolant inlet of the heat sink and to supply the coolant from the coolant outlet of the heat sink to the coolant inlet of the radiator;

wherein the heat-radiating portion of the radiator has an impeller-facing area facing the impeller and a non-impeller-facing area which is different from the impeller-facing area and does not face the impeller;

wherein the electric pump is arranged at a position opposing the non-impeller-facing area;

wherein the electric fan has a housing which comprises a motor driving the impeller, a venturi having at one end thereof a suction port opposite to the impeller-facing area of the heat-radiating portion of the radiator and a discharge port at the other end, and a duct-forming wall portion formed contiguous to the venturi to lead air coming out of the non-impeller-facing area of the heat-radiating portion to the suction port;

wherein the duct-forming wall portion is formed with an opening to expose a heat generating portion of the electric pump;

wherein the discharge port of the venturi of the electric fan is attached with a fan guard with a removable mounting structure;

wherein the fan guard has a guard portion facing the discharge port and a plurality of snap-in hooks arranged at circumferentially equal intervals on an outer circumferential part of the guard portion;

wherein an outer circumferential part of the venturi of the electric fan has a plurality of engaged portions integrally formed therewith to which the hooks are snap-in-connected;

wherein the mounting structure is constructed of the plurality of hooks and the plurality of engaged portions;

wherein the outer circumferential part of the venturi of the electric fan is formed integrally with a plurality of stopper portions on which free ends of the plurality of hooks may abut, the hooks being snap-in-connected with the plurality of engaged portions:

wherein the guard portion of the fan guard has an abutment portion that abuts on a casing of the motor; and wherein a shape and dimension of the abutment portion is determined such that, with the plurality of hooks engaging the plurality of the engaged portions, the abutment portion abuts on the casing and the guard portion is deflected toward the discharge port.

9. An electronic component cooling apparatus comprising:

a heat sink having an electronic component mounting surface on which an electronic component to be cooled is mounted, a coolant inlet and a coolant outlet, and a coolant path in which a liquid as a coolant flows to forcibly cool the electronic component mounting surface;

a radiator having a coolant inlet and a coolant outlet and a liquid path in which the coolant flows, the liquid path being air-cooled to cool the coolant;

an electric fan mounted on a heat-radiating portion of the radiator to generate a cooling air flow by a rotation of an impeller having a plurality of blades in order to cool the heat-radiating portion of the radiator; and an electric pump to supply a moving energy to the coolant so that the coolant coming out of the coolant outlet of the radiator to the coolant inlet of the heat sink and to supply the coolant from the coolant outlet of the heat sink to the coolant inlet of the radiator;

wherein the heat-radiating portion of the radiator has an impeller-facing area facing the impeller and a non-impeller-facing area which is different from the impeller-facing area and does not face the impeller;

wherein the electric pump is arranged at a position opposing the non-impeller- facing area;

wherein the electric pump comprises:

an impeller having a plurality of radially extending blades and rotating about its axis; and a housing having a liquid inlet and a liquid outlet and an impeller-receiving chamber therein, in which the impeller is submerged in the coolant and, when rotating, draws in the coolant at the liquid inlet and delivers it from the liquid outlet;

wherein the liquid inlet is formed in one of a plurality of wall portions surrounding the impeller-receiving chamber which opposes the plurality of blades so as to be positioned where the axis is extended;

wherein the liquid outlet is formed in one of the wall portions which is situated in a direction perpendicular to the axis;

wherein the wall portion with the liquid inlet is formed with an annular groove surrounding the liquid inlet completely and opening toward the impeller and also with a plurality of narrow grooves arranged outside so as not to be connected to the annular groove, radially extending from the axis as a center, and opening toward the impeller;

wherein shapes and dimensions of the annular groove and the plurality of narrow grooves are determined such that dirt and air bubbles entering at the liquid inlet into the impeller-receiving chamber are crushed between the plurality of blades and edges of the annular groove and the narrow grooves and moved radially outwardly along the narrow grooves by a centrifugal force for discharging from the liquid outlet.

10. An electronic component cooling apparatus comprising:

a heat sink having an electronic component mounting surface on which an electronic component to be cooled is mounted, a coolant inlet and a coolant outlet, and a coolant path in which a liquid as a coolant flows to forcibly cool the electronic component mounting surface;

a radiator having a coolant inlet and a coolant outlet and a liquid path in which the coolant flows, the liquid path being air-cooled to cool the coolant;

an electric fan mounted on a heat-radiating portion of the radiator to generate a cooling air flow by a rotation of an impeller having a plurality of blades in order to cool the heat-radiating portion of the radiator; and an electric pump to supply a moving energy to the coolant so that the coolant coming out of the coolant outlet of the radiator to the coolant inlet of the heat sink and to supply the coolant from the coolant outlet of the heat sink to the coolant inlet of the radiator;

wherein the heat-radiating portion of the radiator has an impeller-facing area facing the impeller and a non-impeller-facing area which is different from the impeller-facing area and does not face the impeller;

wherein the electric pump is arranged at a position opposing the non-impeller-facing area;
wherein the electric pump comprises:
an impeller having a plurality of radially extending blades and rotating about its axis; and
a housing having a liquid inlet and a liquid outlet and an impeller-receiving chamber therein, in which the impeller is submerged in the coolant and, when rotating, draws in the coolant at the liquid inlet and delivers it from the liquid outlet;
wherein the liquid inlet is formed in one of a plurality of wall portions surrounding the impeller-receiving chamber which opposes the plurality of blades in a manner that the liquid inlet is positioned where the axis is extended;
wherein the liquid outlet is formed in one of the wall portions which is situated in a direction perpendicular to the axis;
wherein the wall portion with the liquid inlet is formed with a plurality of narrow grooves not connected with the liquid inlet, radially extending from the axis as a center, and opening only toward the impeller;
wherein shapes and dimensions of the plurality of narrow grooves are determined such that dirt and air bubbles entering at the liquid inlet into the impeller-receiving chamber are crushed between the plurality of blades and edges of the narrow grooves, and moved radially outwardly along the narrow grooves by a centrifugal force for discharging from the liquid outlet.

11. The electronic component cooling apparatus according to claim 9, wherein a wall surface, which is one of the wall surfaces surrounding the narrow groove and is positioned radially outwardly, has a taper gradually inclined to the wall facing to the plurality of the blades.

12. The electronic component cooling apparatus according to claim 9, wherein the plurality of narrow grooves are formed at circumferentially equal intervals.

13. The electronic component cooling apparatus according to claim 9, wherein the impeller has a plurality of permanent magnetic poles arranged around the axis as a center;
wherein a plurality of drive permanent magnetic poles rotated by a drive motor of the electric pump are arranged at positions facing the plurality of permanent magnetic poles having a partition wall therebetween so that the impeller is rotated by a magnetic attraction generated between the plurality of drive permanent magnetic poles and the plurality of permanent magnetic poles.

14. The electronic component cooling apparatus according to claim 1, wherein the radiator has a construction in which the heat-radiating portion is arranged between an upper tank and a lower tank;
wherein, if a direction from the electric fan toward the radiator is taken to be a thickness direction of the radiator, dimensions in the thickness direction of the upper tank and the lower tank are set larger than a dimension in the thickness direction of the heat-radiating portion.

15. The electronic component cooling apparatus according to claim 14, wherein a volume of the upper tank is set larger than a volume of the lower tank, and
an air space, compressed when the coolant expands, is formed in the upper tank.

16. The electronic component cooling apparatus according to claim 15, wherein reducing gas is contained in the air space.

17. The electronic component cooling apparatus according to claim 16, wherein nitrogen gas is used as the reducing gas.

18. The electronic component cooling apparatus according to claim 15, wherein an inlet side extension pipe portion extends from the coolant inlet of the radiator into the upper tank or lower tank, and an outlet side extension pipe portion extends from the coolant outlet of the radiator into the upper tank or lower tank;
wherein the inlet side extension pipe portion and the outlet side extension pipe portion are arranged so that their terminal open ends are always immersed in the coolant whatever attitude the radiator takes.

19. The electronic component cooling apparatus according to claim 14, wherein outer wall portions of the upper tank and the lower tank are integrally formed with mounting fittings for mounting on a support portion.

20. An electronic component cooling apparatus comprising:
a heat sink having an electronic component mounting surface on which an electronic component to be cooled is mounted, a coolant inlet and a coolant outlet, and a coolant path in which a liquid as a coolant flows to forcibly cool the electronic component mounting surface;
a radiator having a coolant inlet and a coolant outlet and a liquid path in which the coolant flows, the liquid path being air-cooled to cool the coolant;
an electric fan mounted on a heat-radiating portion of the radiator to generate a cooling air flow by a rotation of an impeller having a plurality of blades in order to cool the heat-radiating portion of the radiator; and
an electric pump to supply a moving energy to the coolant so that the coolant coming out of the coolant outlet of the radiator to the coolant inlet of the heat sink and to supply the coolant from the coolant outlet of the heat sink to the coolant inlet of the radiator;
wherein the heat-radiating portion of the radiator has an impeller-facing area facing the impeller and a non-impeller-facing area which is different from the impeller-facing area and does not face the impeller;
wherein the electric pump is arranged at a position opposing the non-impeller-facing area;
wherein the radiator has a construction in which the heat-radiating portion is arranged between an upper tank and a lower tank;
wherein, if a direction from the electric fan toward the radiator is taken to be a thickness direction of the radiator, dimensions in the thickness direction of the upper tank and the lower tank are set larger than a dimension in the thickness direction of the heat-radiating portion;
wherein outer wall portions of the upper tank and the lower tank are integrally formed with mounting fittings for mounting on a support portion;
wherein the mounting fittings comprise first mounting fittings which, when mounted on the support portion, constitute a hinge mechanism and second mounting fittings that are secured to the support portion by using a fixing means such as screws and bolts;
wherein the first mounting fitting attached to the upper tank and the first mounting fitting attached to the lower tank are vertically aligned.

21. The electronic component cooling apparatus according to claim 20, wherein the first mounting fittings are each made up of two pin-like fittings spaced from each other in the thickness direction;
wherein the support portion is constructed to hold the two pin-like fittings in such a manner that one of the two pin-like fittings pivots within a predetermined angle about the other pin-like fitting;

wherein the second mounting fittings are formed with holes through which screws or bolts pass.

22. The electric component cooling apparatus according to claim 19, wherein each outer wall portion of the upper tank and the lower tank is integrally formed with one or more reinforcing ribs for enhancing mechanical strength of the outer wall portions.

23. The electronic component cooling apparatus according to claim 1, wherein the coolant is contained in a system including the radiator at a pressure lower than an atmospheric pressure.

24. The electronic component cooling apparatus according to claim 1, wherein the coolant inlet and coolant outlet of the radiator, the coolant inlet and coolant outlet of the heat sink and a liquid inlet and liquid outlet of the pump are provided with outwardly extending tube connection cylindrical pipes;
  wherein end portions of a flexible tube are fitted over outer circumferential parts of the associated tube connection cylindrical pipes;
  wherein the outer circumferential part of each tube connection cylindrical pipe is formed with one or more edge-forming projections each of which has an inclined surface increasing in diameter from a front end side toward a base portion side of the tube connection cylindrical pipe, and an edge-forming surface extending from a tip of the inclined surface toward the tube connection cylindrical pipe to form an edge that bites into an inner wall of the tube, between the inclined surfaces.

25. The electronic component cooling apparatus according to claim 24, wherein the tube is formed of fluororesin and an outer circumferential part of a main part of the tube is formed with a spiral groove extending longitudinally of the tube or bellows-like grooves.

26. The electronic component cooling apparatus according to claim 25, wherein each portion to be bended of the tube is bended-by forming technique before mounted.

27. An electronic component cooling apparatus comprising:
  a heat sink having an electronic component mounting surface on which an electronic component to be cooled is mounted, a coolant inlet and a coolant outlet, and a coolant path in which a liquid as a coolant flows to forcibly cool the electronic component mounting surface;
  a radiator having a coolant inlet and a coolant outlet and a liquid path in which the coolant flows, the liquid path being air-cooled to cool the coolant;
  an electric fan mounted on a heat-radiating portion of the radiator to generate a cooling air flow by a rotation of an impeller having a plurality of blades and thereby cool the heat-radiating portion of the radiator; and
  an electric pump to supply a moving energy to the coolant so that the coolant coming out of the coolant outlet of the radiator to the coolant inlet of the heat sink and to supply the coolant from the coolant outlet of the heat sink to the coolant inlet of the radiator;
  wherein the radiator is secured to a support portion with a gasket mounted therebetween, the gasket being formed of an elastic material and disposed between the support portion and a peripheral portion of a surface of the radiator on the side not facing the electric fan;
  wherein the radiator is mounted with a gasket support member which supports the gasket out of contact with the heat-radiating portion, and which restricts a deformation of the gasket such that the gasket, when pressed against the support portion, can be brought into stable and tight contact with the support portion.

28. The electronic component cooling apparatus according to claim 27, wherein the gasket support member is removably mounted on the radiator.

* * * * *